United States Patent [19]

Itou

[11] Patent Number: 5,894,446
[45] Date of Patent: Apr. 13, 1999

[54] SEMICONDUCTOR MEMORY DEVICE OPERABLE WITH REDUCED CURRENT CONSUMPTION IMMEDIATELY AFTER POWER-ON

[75] Inventor: Takashi Itou, Hyogo, Japan

[73] Assignee: Mitsubishi Denki Kabushiki Kaisha, Tokyo, Japan

[21] Appl. No.: 08/937,621

[22] Filed: Sep. 25, 1997

[30] Foreign Application Priority Data

Feb. 14, 1997 [JP] Japan ............................. 9-030094

[51] Int. Cl.$^6$ ............................................. G11C 7/00
[52] U.S. Cl. ........................... 365/222; 365/226; 365/227
[58] Field of Search ............................. 365/222, 267, 365/227

[56] References Cited

U.S. PATENT DOCUMENTS

| | | | |
|---|---|---|---|
| 4,716,551 | 12/1987 | Inagaki | 365/222 |
| 4,933,902 | 6/1990 | Yamada et al. | 365/226 |
| 5,278,792 | 1/1994 | Inoue et al. | 365/226 |
| 5,338,282 | 8/1994 | Koike | 365/222 |
| 5,404,335 | 4/1995 | Tobita | 365/222 |
| 5,477,491 | 12/1995 | Shirai | 365/222 |
| 5,568,440 | 10/1996 | Tsukude et al. | 365/222 |
| 5,594,699 | 1/1997 | Nomura et al. | 365/222 |
| 5,633,831 | 5/1997 | Tsukude et al. | 365/222 |

FOREIGN PATENT DOCUMENTS 64-27094  1/1989  Japan.
3-272088  12/1991  Japan.

*Primary Examiner*—David Nelms
*Assistant Examiner*—Tuan T. Nguyen
*Attorney, Agent, or Firm*—McDermott, Will & Emery

[57] ABSTRACT

An initializing circuit activates a self-refresh control signal generating circuit in response to power-on. The semiconductor memory device enters a self-refresh mode immediately after the power-on, and an RAS-related control circuit is in the initial state immediately after the power-on regardless of the logical state of external row address strobe signal /RAS, so that the current consumption can be nearly equal to a standby current.

10 Claims, 13 Drawing Sheets

FIG. 6A
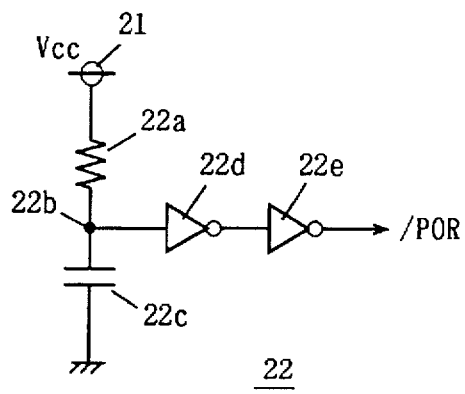
FIG. 6B
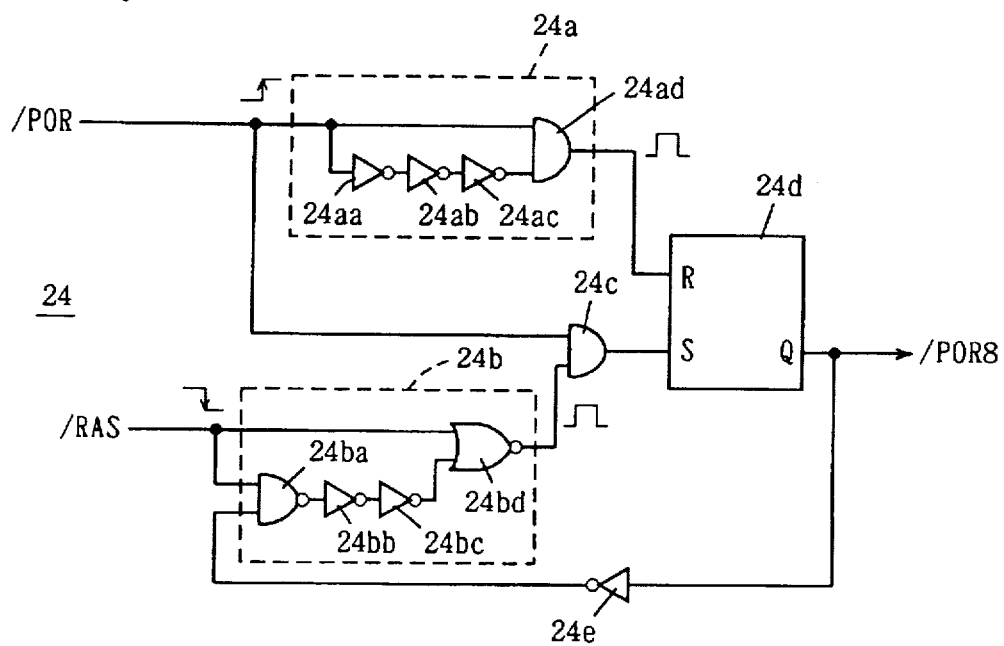
FIG. 7

FIG. 20
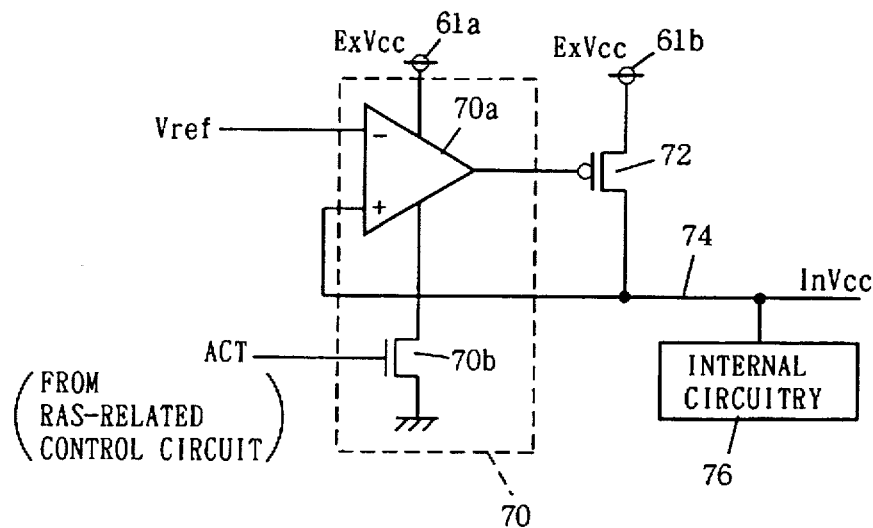
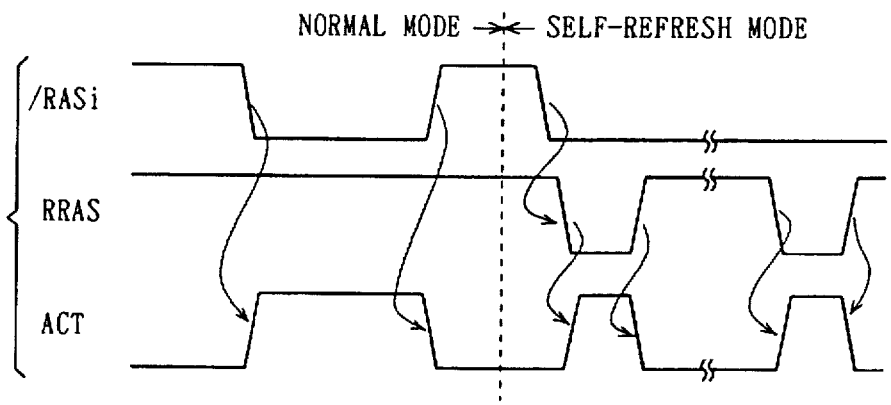
FIG. 21
FIG. 22
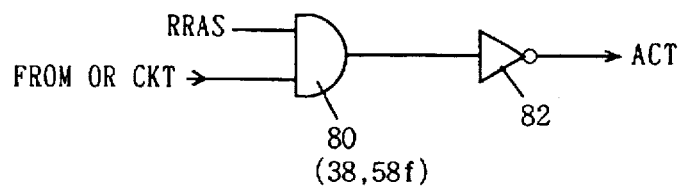

FIG. 25 PRIOR ART
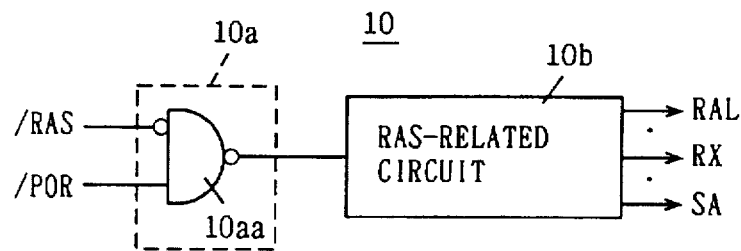
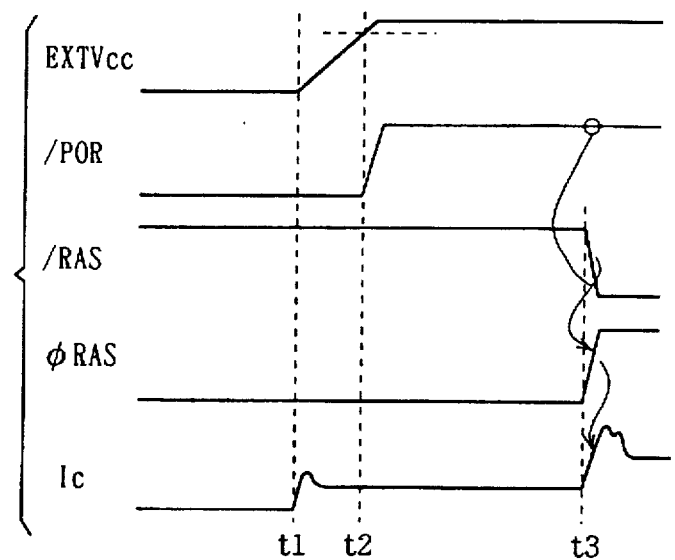
FIG. 26 PRIOR ART
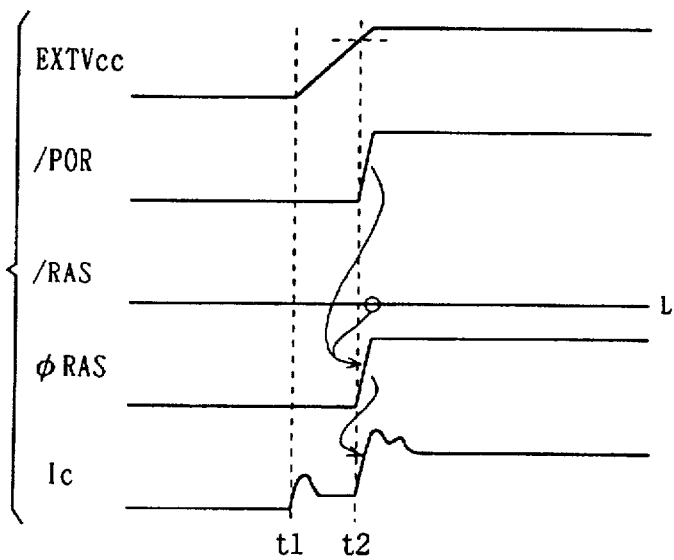
FIG. 27 PRIOR ART

SEMICONDUCTOR MEMORY DEVICE OPERABLE WITH REDUCED CURRENT CONSUMPTION IMMEDIATELY AFTER POWER-ON

BACKGROUND OF THE INVENTION

1. Field of the Invention

The present invention relates to a semiconductor memory device, and in particular to a dynamic semiconductor memory device operable in a self-refresh mode for internally and periodically refreshing data of memory cells. More particularly, the invention relates to a structure for reducing a current consumption of the semiconductor memory device immediately after supply of a power, i.e., power-on.

2. Description of the Background Art

FIG. 23 schematically shows a whole structure of a conventional dynamic semiconductor memory device. In FIG. 23, the conventional semiconductor memory device includes a memory cell array 1 having a plurality of memory cells MC arranged in a matrix form, an address buffer 2 for taking in an externally supplied address signal Ad and producing an internal row address signal and an internal column address signal, a row select circuit 4 which decodes the internal row address signal from the address buffer 2 when activated, and drives a corresponding row in the memory cell array 1 to the selected state in accordance with the result of decoding, a sense amplifier band 6 which senses, amplifies and latches data of the memory cell columns (bit line pairs BL and /BL) in memory cell array 1 when activated, and a column select circuit 8 which decodes the column address signal from address buffer 2 when activated, and selects an addressed column in the memory cell array 1 for connecting the same to an internal data bus.

In memory cell array 1, word lines WL are arranged corresponding to the rows of memory cells, respectively, and bit line pairs BL and /BL are arranged corresponding to the columns of memory cells, respectively. FIG. 23 representatively shows one word line WL and one bit line BL. Memory cell MC includes a capacitor C for storing information, and an access transistor T which connects capacitor C to corresponding bit line BL (or bit line /BL) when the corresponding word line is selected.

Row select circuit 4 includes a row decode circuit which decodes the internal row address signal from address buffer 2, and a word line drive circuit for driving word line WL, which is arranged corresponding to the row addressed in accordance with the output signal of the row decoder circuit, to the selected state.

Sense amplifier band 6 includes sense amplifier circuits which are arranged corresponding to the bit line pairs, respectively. Generally, bit lines BL and /BL during standby are precharged, e.g., to an intermediate voltage level, and data of the memory cell is read onto one of paired bit lines BL and /BL in an active cycle. The sense amplifier circuit differentially amplifies and latches potentials on a corresponding bit line pair.

Column select circuit 8 includes a column decode circuit which decodes the internal column address signal from address buffer 2, and an I/O gate which connects a corresponding column in memory cell array 1 to an internal data line in accordance with the column select signal from the column decode circuit.

The semiconductor memory device further includes an internal control signal generating circuit 10 which generates required internal control signals in accordance with externally applied row address strobe signal /RAS, column address strobe signal /CAS and write enable signal /WE, and an I/O (input/output) circuit 12 which performs external input/output of data to and from the memory cell selected by column select circuit 8 under the control of internal control signal generating circuit 10.

Row address strobe signal /RAS is a signal defining a memory cycle, and more specifically defines a standby cycle and an active cycle. When this row address strobe signal /RAS is activated to attain L-level, the semiconductor memory device starts the memory cell selection operation. Column address strobe signal /CAS is a signal providing a start timing of the column selection operation. Write enable signal /WE is a signal designating data write/read modes. The timing of data reading is determined by column address strobe signal /CAS, and the timing of writing data into the selected memory cell is determined by activation of both column address strobe signal /CAS and write enable signal /WE. Now, an operation of the semiconductor memory device shown in FIG. 23 will be described below with reference to an operation waveform diagram of FIG. 24.

When row address strobe signal /RAS is at H-level, this semiconductor memory device is in a standby cycle, and each of internal circuits has been precharged. In this standby cycle, precharged potential levels of the internal circuits are predetermined.

When row address strobe signal /RAS falls to L-level, the active cycle starts, and the memory cell selection operation starts. In response to this falling of row address strobe signal /RAS, address buffer 2 takes in externally applied address signal Ad, and forms the internal row address signal for applying the same to row select circuit 4. Row select circuit 4 drives the word line, which corresponds to an addressed row in memory cell array 1, to the selected state in accordance with the applied internal row address signal. The potential on word line WL thus selected rises to H-level. In memory cell MC connected to the selected word line WL, access transistor T is turned on, and charges stored in capacitor C are read onto corresponding bit line BL or /BL. The other of paired bit lines holds the precharged potential level. FIG. 24 shows potential variations on bit lines BL and /BL in the case where data at L-level is stored in the memory cell. When the word line is driven to the selected state, and the potential difference on the bit line pair increases, sense amplifier band 6 is activated, and the potentials on each bit line pair are differentially amplified and latched.

When column address strobe signal /CAS falls from H-level to L-level, address buffer 2 produces and applies the internal column address signal to column select circuit 8 in accordance with externally applied address signal Ad. Column select circuit 8 selects a bit line pair corresponding to the column thus addressed, and connects the same to the internal data bus. When I/O circuit 12 is in the read mode, data of the memory cell on the column selected by column select circuit 8 is output as output data Q.

When one memory cycle is completed, row address strobe signal /RAS and column address strobe signal /CAS rise to H-level, and the internal circuits return to predetermined initial states, respectively. Thus, the potential level of selected word line WL lowers to ground potential level achieving the nonselected state, and bit lines BL and /BL are precharged to the predetermined intermediate potential level.

In the dynamic semiconductor memory device, as described above, the active cycle starts in such a state that internal signal lines and nodes are already precharged to predetermined potential levels, respectively. In a normal operation mode, row address strobe signal /RAS is lowered to L-level, and thereafter column address strobe signal /CAS is lowered to L-level. When column address strobe signal /CAS is lowered to L-level prior to lowering of row address strobe signal /RAS, a special mode such as a self-refresh mode is executed as will be described later.

FIG. 25 schematically shows a structure of a portion related to row address strobe signal /RAS and contained in internal control signal generating circuit 10 shown in FIG. 23. In FIG. 25, internal control signal generating circuit 10 includes an RAS buffer 10a which receives row address strobe signal /RAS and a power-on detection signal /POR, and generates the internal row address strobe signal in accordance with row address strobe signal /RAS when power-on detection signal /POR is active (H-level), and an RAS-related control circuit 10b which generates control signals for controlling operation of circuit portions (i.e., RAS-related circuits) related to row address strobe signal /RAS in accordance with the internal row address strobe signal from RAS buffer 10a.

RAS buffer 10a includes a gate circuit 10aa which drives the internal row address strobe signal to the active state of L-level when power-on detection signal /POR is in the active state of H-level and row address strobe signal /RAS is at L-level. Power-on detection signal /POR attains the active state of H-level when an externally applied power supply voltage is stabilized at a predetermined voltage level or a steady state.

RAS-related control circuit 10b generates control signals for controlling circuit portions related to row address strobe signal /RAS, i.e., circuits in portions related to the row selection. FIG. 25 representatively shows a row address latch instructing signal RAL for latching, as a row address signal, an external address signal applied to the row address buffer, a word line drive signal RX for providing a timing at which a selected word line is driven to the selected state in the memory cell array, and a sense amplifier activating signal SA for activating the sense amplifier band.

RAS-related control circuit 10b further generates other signals such as a bit line equalize/precharge signal for precharging/equalizing the bit lines to a predetermined potential, and a row decoder enable signal for activating the row decoder included in the row select circuit. Under the control of RAS-related control circuit 10b, row select circuit 4 and sense amplifier band 6 operate to perform operations including sensing, amplification and latching of data of memory cells connected to the selected word line when the internal row address strobe signal is active. Operations of the internal control signal generating circuit shown in FIG. 25 will be described below with reference to FIGS. 26 and 27.

Referring first to FIG. 26, description will now be given on the operation performed when the semiconductor memory device is powered on while row address strobe signal /RAS is at H-level. At time t1, row address strobe signal /RAS is at H-level, and the power is turned on, so that a potential level of an external power supply voltage EXTVcc rises. At the time of power-on, power-on detection signal /POR is still at L-level, and the internal row address strobe signal from RAS buffer 10a is at H-level.

In this state, each of the internal circuits in the semiconductor memory device is set to the initial state, and a slightly large current Ic is consumed for precharging each internal signal line to the initial state. After each of the internal signal lines and internal nodes is set to the initial state, each internal signal line is driven to a predetermined potential level in accordance with rising of the potential level of external power supply voltage EXTVcc. In this state, only a small standby current flows.

At time t2, external power supply voltage EXTVcc reaches a predetermined voltage level (or reaches the steady state at a predetermined voltage level), and responsively power-on detection signal /POR attains H-level. In RAS buffer 10a, row address strobe signal /RAS is at H-level, and therefore internal row address strobe signal from gate circuit 10aa is in the inactive state of H-level, and the internal circuits maintain the standby state.

At time t3, row address strobe signal /RAS is lowered to L-level for performing, e.g., a dummy cycle. Thereby, internal row address strobe signal from RAS buffer 10a lowers to L-level, and a control signal from RAS-related control circuit 10b is driven to the active state. In FIG. 26, an RAS-related control signal φRAS is representatively shown as a signal for controlling the RAS-related circuits related to row address strobe signal /RAS. In accordance with activation of RAS-related control signal φRAS, an internal circuit operates and a large current Ic flows, and sense amplifier band 6 (see FIG. 23) operates to sense and amplify memory cell data. Thereafter, current Ic is stabilized at a constant current level.

Therefore, when the semiconductor memory device is powered on in such a state that externally applied row address strobe signal /RAS is set to H-level under control of a memory controller, each internal node can be precharged with a low current consumption with the internal circuit maintained at the initial state.

Power-on detection signal /POR is supplied only to RAS buffer 10a. A CAS buffer receiving column address strobe signal /CAS is not supplied with power-on detection signal /POR. This is because activation of the internal column address strobe signal is performed after activation of the internal row address strobe signal.

When the semiconductor memory device is powered on with row address strobe signal /RAS set at H-level, in the semiconductor memory device, the internal row address strobe signal from the RAS buffer is inactive, and the internal circuits are supplied with current while maintaining the standby state, and are set to the initial state. Therefore, the current supply amount at the time of power-on slightly increases only immediately after power-on, and can be sufficiently small. Generally, a current flowing through the semiconductor memory device on standby is tens of microamperes to several microamperes.

However, there are some cases in which the memory controller may malfunction, e.g., during rise-up of the system power, and a power is supplied to the semiconductor memory device with row address strobe signal /RAS being at L-level. This state will be described below with reference to FIG. 27.

At time t1, row address strobe signal /RAS is at L-level, and the device is powered on. At time t1, the voltage level of external power supply voltage EXTVcc starts to rise. At this time, power-on detection signal /POR is still at L-level, the internal row address strobe signal from RAS buffer 10a is inactive, and the internal circuits in standby state are supplied with a current and internal nodes and signal lines are precharged to a predetermined potential. During this period, therefore, a slightly large current flows for charging the internal signal lines and internal nodes at time t1, i.e., only at the time of power-on, and the steady state is subsequently attained, so that the internal signal lines and internal nodes are precharged to the predetermined potentials, respectively.

At time t2, external power supply voltage EXTVcc reaches the predetermined voltage level or is stabilized at the constant voltage level, and power-on detection signal /POR rises to H-level. In response to rising of power-on detection signal /POR, the internal row address strobe signal from gate circuit 10aa attains L-level, and RAS-related control circuit 10b is activated. Thereby, RAS-related control signal φRAS is activated, and the internal circuit operates, so that a large current flows. Subsequently, the sense amplifier completes its operation, and stabilization is attained with a relatively large current flowing.

When the power is turned on with row address strobe signal /RAS set at L-level, the internal circuit operates in response to rising of power-on detection signal /POR, and a large operation current flows. Then, a stabilized state of the internal circuit is attained with a relatively large current flowing. This results in disadvantageous increase in current consumption immediately after power-on.

SUMMARY OF THE INVENTION

An object of the invention is to provide a semiconductor memory device which can reduce a current consumption immediately after power-on regardless of a logical level of a row address strobe signal being an operation cycle determining signal.

Another object of the invention is to provide a semiconductor memory device which can reduce a current consumption during a period from power-on to start of an operation of an internal circuit in accordance with a row address strobe signal being an operation cycle determining signal.

A semiconductor memory device according to the invention includes a self-refresh control circuit including a timer and being operable to generate a control signal for refreshing storage data of a memory cell at predetermined time intervals in accordance with an output signal of the timer when activated, and an initializing circuit for activating the self-refresh control circuit in response to power-on, i.e., the start of power supply.

When the power is turned on, the semiconductor memory device is set into a self-refresh mode, whereby the semiconductor memory device internally performs self-refreshing at the predetermined time intervals in accordance with the timer. Therefore, internal circuits, particularly RAS-related circuits are in a standby state or operate only intermittently, and they are not placed in a continuously operating state, so that an average current consumption after power-on can be reduced.

By entering the device into the self-refresh mode, the internal circuits of the semiconductor memory device can be set to the initial state, and thus do not operate until the self-refreshing is performed, so that a current consumption can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6A shows an example of a structure of a power-on detecting circuit shown in FIG. 1;

FIG. 6B is a waveform diagram representing an operation of a power-on detecting circuit shown in FIG. 6A;

FIG. 7 shows an example of a structure of a dummy cycle detecting circuit shown in FIG. 1;

FIG. 15 is a signal waveform diagram representing an operation of the initializing circuit shown in FIG. 13 immediately after power-on;

FIG. 20 schematically shows a structure of an internal step-down circuit in an embodiment 5 of the invention;

FIG. 21 shows a timing relationship between an activation control signal and an internal row address strobe signal shown in FIG. 20;

FIG. 22 schematically shows a structure of an activation control signal generating circuit shown in FIG. 20;

FIG. 25 schematically shows a structure of an internal control signal generating circuit shown in FIG. 23;

FIG. 26 is a waveform diagram representing an operation of the circuit shown in FIG. 25 immediately after power-on; and FIG. 27 is a waveform diagram representing an operation of the circuit shown in FIG. 25 immediately after power-on.

DESCRIPTION OF THE PREFERRED EMBODIMENTS

First Embodiment

Figure 1:
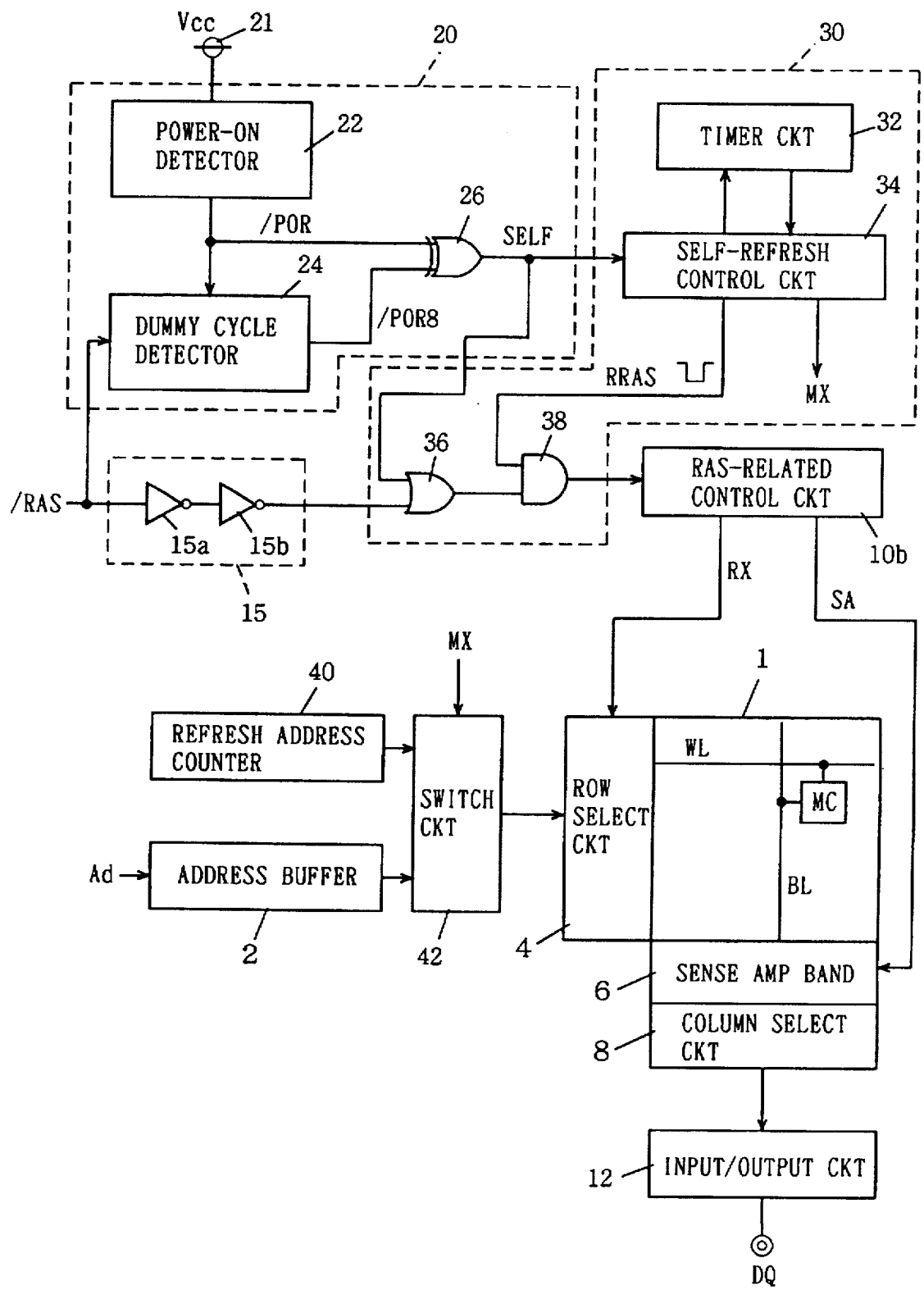
FIG. 1 schematically shows a whole structure of a semiconductor memory device according to an embodiment 1 of the invention.

FIG. 1 schematically shows a whole structure of a semiconductor memory device according to an embodiment 1 of the invention. In FIG. 1, the semiconductor memory device includes, similarly to the prior art device, a memory cell array 1 having a plurality of memory cells MC, an address buffer 2 which receives an externally supplied address signal and produces an internal address signal, a row select circuit 4 for driving an addressed row to the selected state in accordance with a received address signal, a sense amplifier band 6 which senses, amplifies and latches data of a selected memory cell in memory cell array 1, a column select circuit 8 for selecting a column in memory cell array 1, and an input/output circuit 12 for performing external input/output of data into and from the device.

This semiconductor memory device further includes an RAS buffer 15 which receives externally supplied row address strobe signal /RAS and produces an internal row address strobe signal, an initializing circuit 20 for setting the semiconductor memory device into the self-refresh mode upon power-on, i.e., start of power supply, and a self-refresh control signal generating circuit 30 which generates control signals required for the self-refresh operation under control of initializing circuit 20.

RAS buffer 15 includes two cascaded inverters 15a and 15b receiving externally applied row address strobe signals /RAS. Initializing circuit 20 includes a power-on detecting circuit 22 which is coupled to a power supply node 21 and drives a power-on detection signal /POR to the active state when it detects application of power supply voltage Vcc onto this power supply node, and a dummy cycle detecting circuit 24 which is initialized and activated in accordance with an output signal of power-on detecting circuit 22.

Dummy cycle detecting circuit 24 thus activated drives a dummy cycle detection signal /POR8 to the active state when it detects designation of the dummy cycle in accordance with externally applied row address strobe signal /RAS. Initializing circuit 20 further includes a gate circuit 26 which generates a self-refresh instructing signal SELF in accordance with power-on detection signal /POR and dummy cycle detection signal /POR8.

Power-on detecting circuit 22 drives power-on detection signal /POR to the active state when power supply voltage Vcc on power supply node 21 reaches a predetermined voltage level or is stabilized at a constant voltage level. When dummy cycle detecting circuit 24 detects designation of the dummy cycle, it activates dummy cycle detection signal /POR8 if power-on detection signal /POR is active and row address strobe signal /RAS is activated. This dummy cycle is performed for reliably setting internal circuits in the semiconductor memory device to the initial state.

Gate circuit 26 is formed of an exclusive-OR circuit. When power-on detection signal /POR and dummy cycle detection signal /POR8 are at the same logical level, gate circuit 26 keeps self-refresh instructing signal SELF inactive. Thus, self-refresh instructing signal SELF is kept active while power-on detection signal /POR is active and the dummy cycle is not yet designated.

Self-refresh control signal generating circuit 30 includes a timer circuit 32 which activates (generates) a self-refresh request signal at predetermined time intervals when activated, a self-refresh control circuit 34 which activates the timer circuit 32 in response to activation of self-refresh instructing signal SELF from initializing circuit 20, and generates a refresh activating signal RRAS in accordance with the self-refresh request signal from the timer circuit 32, an OR circuit 36 which receives the internal row address strobe signal from RAS buffer 15 and self-refresh instructing signal SELF, and an AND circuit 38 which receives an output signal of OR circuit 36 and refresh activating signal RRAS.

The output signal of AND circuit 38 is applied to RAS-related control circuit 10b. RAS-related control circuit 10b includes a structure similar to that in the prior art device, and controls operations of circuitry related to signal /RAS, i.e., operations of portions related to row selection. As output signals of RAS-related control circuit 10b, FIG. 1 representatively shows a word line activation timing signal RX applied to row select circuit 4, and a sense amplifier activating signal SA applied to sense amplifier band 6.

The semiconductor memory device further includes a refresh address counter 40 which is activated under control of self-refresh control circuit 34 to increment or decrement its count by one every time the self-refresh is performed, and a switch circuit 42 which selects one of the addresses from refresh address counter 40 and address buffer 2 and applies the same to row select circuit in accordance with a switch control signal MX from self-refresh control circuit 34. In the self-refresh mode, switch circuit 42 selects the refresh address from refresh address counter 40 and applied the same to row select circuit 4 in accordance with switch control signal MX. An operation of the semiconductor memory device according to the foregoing embodiment 1 will be described below with reference to waveform diagrams in FIGS. 2 and 3.

Figure 2:
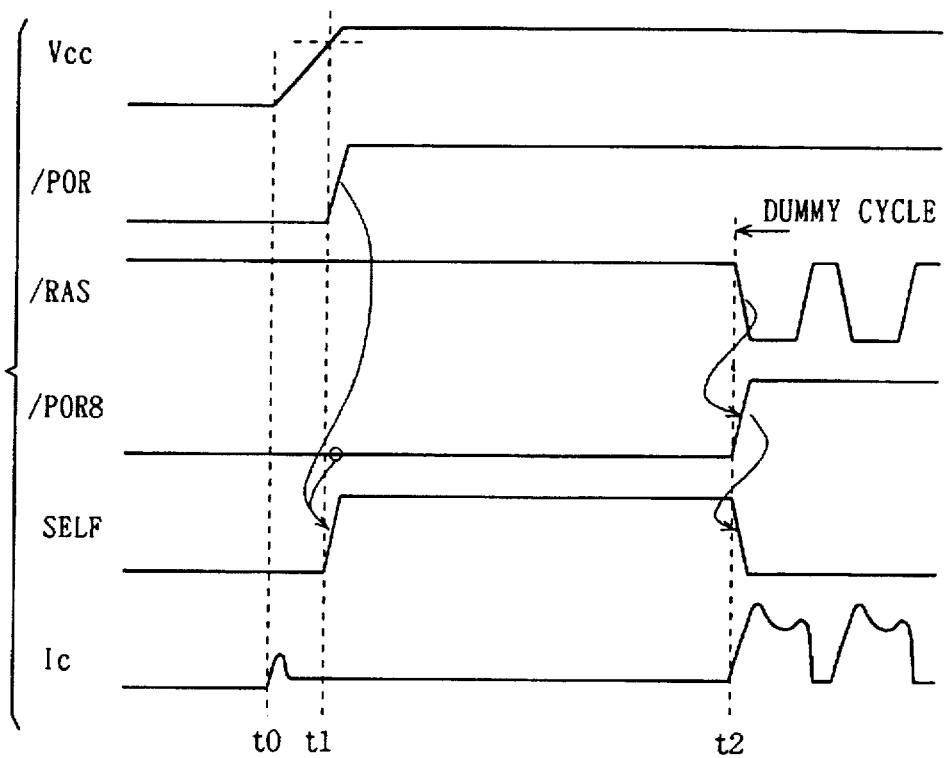
FIG. 2 is a waveform diagram representing an operation immediately after power-on of the semiconductor memory device according to the embodiment 1.

Referring first to FIG. 2, description will be given on an operation in the case where the power is turned on with row address strobe signal /RAS set at H-level. At time t0, row address strobe signal /RAS is at H-level, and the power is turned on, so that the voltage level of power supply voltage Vcc gradually rises. In this state, the internal row address strobe signal from RAS buffer 15 is at H-level, and therefore the semiconductor memory device is in a standby state, so that a small peak current flows immediately after power-on, and subsequently stabilization is attained with a minute current flowing.

At time t1, the voltage level of power supply voltage Vcc reaches a predetermined voltage level or is stabilized at a constant voltage level, so that power-on detection signal /POR from power-on detecting circuit 22 rises to H-level. Since the dummy cycle is not yet designated, dummy cycle detection signal /POR8 is still at L-level. Therefore, self-refresh instructing signal SELF from gate circuit 26 rises to H-level, and self-refresh control circuit 34 is activated. In response to rising of self-refresh instructing signal SELF to H-level, the output signal of OR circuit 36 attains H-level, so that RAS-related control circuit 10b is no longer controlled in accordance with externally supplied row address strobe signal /RAS, and instead RAS-related control circuit 10b is controlled under control of self-refresh control circuit 34.

In response to active state of self-refresh instructing signal SELF for a predetermined time (e.g., 100 μs), the self-refresh is performed, and self-refresh activating signal RRAS is set to the active state of L-level at predetermined time intervals. FIG. 2 shows operation waveforms in the state that the internal self-refreshing is not actually performed when self-refresh instructing signal SELF is activated. This self-refreshing will be described later. During this period, the semiconductor memory device is in a standby state, and only a minute current (of about several microamperes) Ic is consumed.

At time t2, row address strobe signal /RAS is lowered to L-level. Thereby, dummy cycle detecting circuit 24 detects designation of the dummy cycle, and raises dummy cycle detection signal /POR8 to H-level. Since both of power-on detection signal /POR and dummy cycle detection signal /POR8 attain H-level, gate circuit 26 sets self-refresh instructing signal SELF to the inactive state of L-level. Thereby, self-refresh control circuit 34 stops self-refreshing. OR circuit 36 passes therethrough the internal row address strobe signal from RAS buffer 15. Thereby, RAS-related control circuit 10b is activated in accordance with activation of externally supplied row address strobe signal /RAS, and a large operation current (e.g., of several tens of microamperes) flows in the dummy cycle. This dummy cycle is generally executed eight times (i.e., row address strobe signal /RAS is set eight times to the active state of L-level). By alternately repeating active state and precharged state of the internal circuits, each of the internal signal lines and internal nodes can be set to the initial state.

Therefore, when the power is turned on while row address strobe signal /RAS is at H-level, the device consumes only a current similar in magnitude to that in the prior art device.

Figure 3:
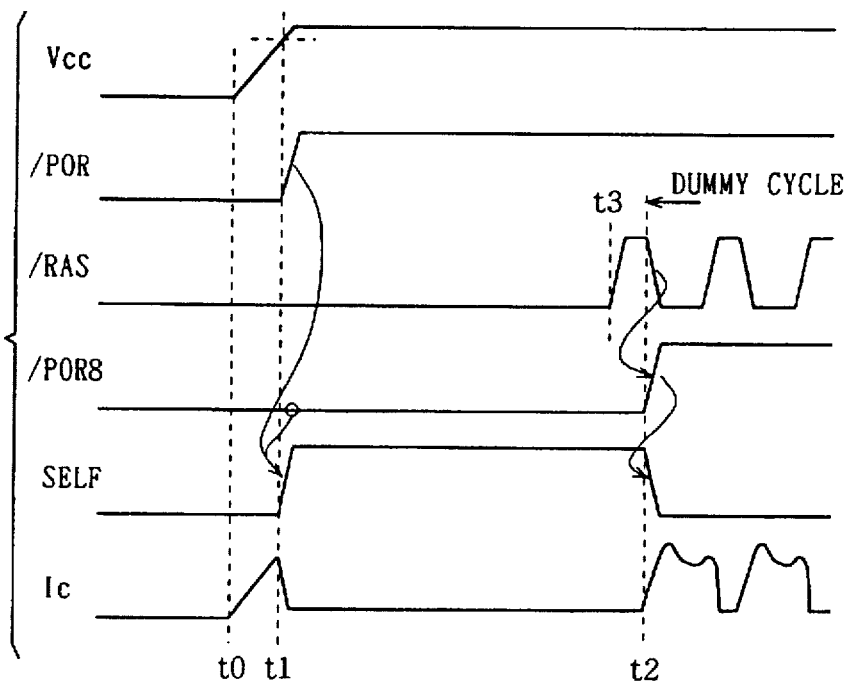
FIG. 3 is a waveform diagram representing an operation immediately after power-on of the semiconductor memory device according to the embodiment 1.

Referring to FIG. 3, description will be given on an operation performed in such a case that the power is turned on with row address strobe signal /RAS at L-level.

At time t0, the power is turned on while row address strobe signal /RAS is at L-level. In accordance with this power-on, the voltage level of power supply voltage Vcc rises. At this time, the internal row address strobe signal from RAS buffer 15 is at L-level, and correspondingly the output signal of OR circuit 36 is at L-level, so that RAS-related control circuit 10b is activated through AND circuit 38. Immediately after this power-on, therefore, with semiconductor memory device being active, the level of its internal power supply voltage rises, and operation current Ic also increases in accordance with this voltage rising (because active circuits, i.e., the row select circuit and sense amplifier band in the active state consume the current).

At time t1, when power supply voltage Vcc reaches the predetermined voltage level or is stabilized at the constant voltage level, power-on detection signal /POR is activated and attains H-level. In response to the activation of power-on detection signal /POR, self-refresh instructing signal SELF from gate circuit 26 is activated and attains H-level, and the output signal of OR circuit 36 attains H-level, so that RAS-related control circuit 10b returns the circuit in the selected or active state to the standby state. Thereby, the semiconductor memory device internally attains the state that the current at the standby level is consumed.

At time t3, row address strobe signal /RAS is once raised to H-level for performing the dummy cycle. Thereafter, row address strobe signal /RAS is lowered to L-level at time t2. In response to lowering of row address strobe signal /RAS, dummy cycle detecting circuit 24 detects designation of the dummy cycle, and sets dummy cycle detection signal /POR8 to the active state of H-level. Since both of power-on detection signal /POR and dummy cycle detection signal /POR8 attain H-level, gate circuit 26 sets self-refresh instructing signal SELF to the inactive state of L-level. Thereby, self-refresh control circuit 34 is released from the self-refresh mode, and returns to the standby state. RAS-related control circuit 10b activates the circuit portions related to row selection, i.e., RAS-related circuits in accordance with the internal row address strobe signal from RAS buffer 15 through OR circuit 36 and AND circuit 38. Thereby, a large operation current flows.

As can be seen from FIG. 3, when the power is turned on with row address strobe signal /RAS set to L-level, a large current flows immediately after the power-on. During a period from time t1 to time t2, however, the semiconductor memory device is in the standby state (assuming that refresh is not performed), and the semiconductor memory device consumes an extremely small current of, e.g., several microamperes. Therefore, the current consumption in a period before the dummy cycle can be significantly smaller than that in the prior art device. There may be a case where the internal signal lines is not precharged to the predetermined level due to the relatively large current flowing immediately after the power-on. At time t1, however, the semiconductor memory device is set to the standby state in accordance with activation of self-refresh instructing signal SELF. Thereby, each of the internal signal lines and internal nodes is precharged to attain the predetermined standby state. Owing to the subsequent dummy cycle, each of the signal lines and internal nodes is reliably precharged to the predetermined potential level.

[Modification]

Figure 4:
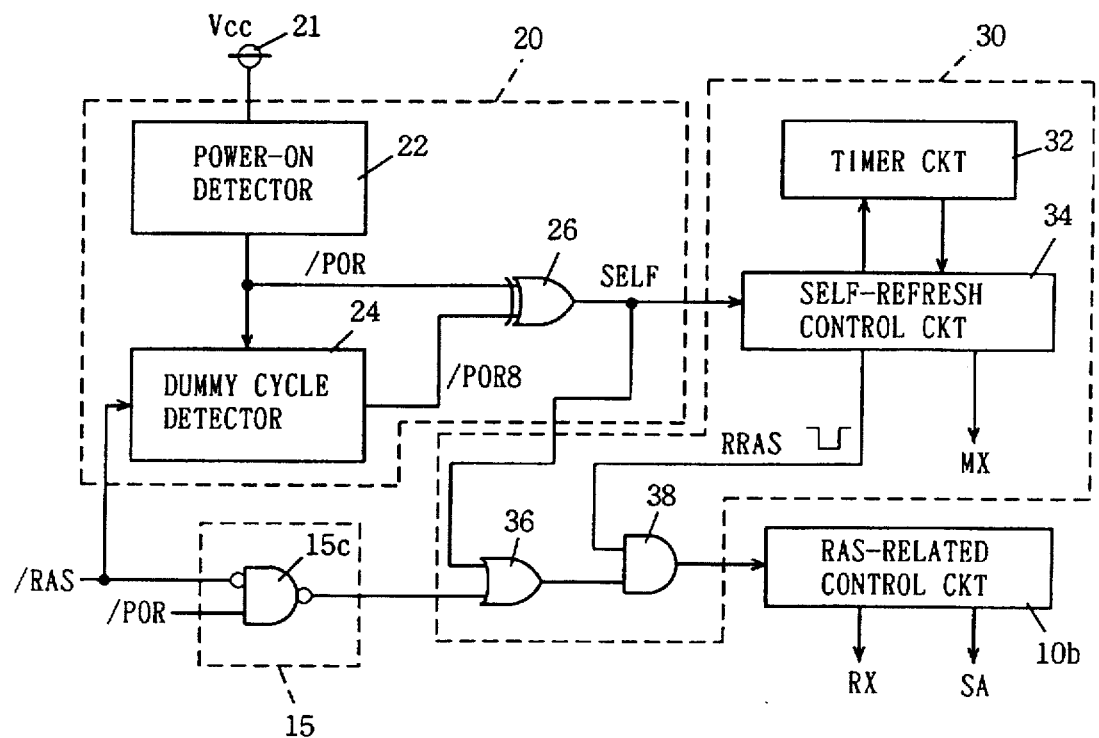
FIG. 4 schematically shows a structure of a modification of the embodiment 1 of the invention.

FIG. 4 shows a structure of a modification of the embodiment 1 of the invention. FIG. 4 shows only a structure of the refresh control portion. The structure shown in FIG. 4 differs from the structure shown in FIG. 1 only in the structure of RAS buffer 15. RAS buffer 15 includes a gate circuit 15c which receives row address strobe signal /RAS and power-on detection signal /POR. The output signal of gate circuit 15c is supplied to one input of OR circuit 36. Other structures are the same as those shown in FIG. 1 and corresponding portions bear the same reference numerals, and will not be described below.

Gate circuit 15c generates a signal at L-level when power-on detection signal /POR is at H-level and row address strobe signal /RAS is at L-level. Therefore, RAS buffer 15 produces, similarly to the prior art device, an internal row address strobe signal in accordance with externally supplied row address strobe signal /RAS after power supply voltage Vcc is stabilized subsequently to the power-on. An operation of the structure shown in FIG. 4 will be described below with reference to an waveform diagram in FIG. 5.

At time t0, the power is turned on, and the voltage level of power supply voltage Vcc rises. Regardless of whether row address strobe signal /RAS is at H-level or L-level, power-on detection signal /POR is at L-level, so that the output signal of RAS buffer 15 is at H-level, and the internal circuits of semiconductor memory device are in the standby state. Therefore, only minute standby current Ic flows after a peak current flowed for precharging the internal nodes to a predetermined potential at time t0.

At time t1, power supply voltage Vcc reaches the predetermined voltage level or is stabilized at the predetermined voltage level. Thereby, power-on detection signal /POR rises to H-level, so that self-refresh instructing signal SELF is set to the active state of H-level. When row address strobe signal /RAS is at L-level, the output signal of RAS buffer 15 lowers to L-level in response to rising of power-on detection signal /POR to H-level. However, OR circuit 36 already keeps its output signal at H-level in accordance with self-refresh instructing signal SELF, and therefore the semiconductor memory device maintains the standby state.

When the dummy cycle is performed at time t2, dummy cycle detection signal /POR8 rises to H-level, and responsively self-refresh instructing signal SELF attains L-level, so that RAS-related control circuit 10b operates in accordance with externally supplied row address strobe signal /RAS, and activates/deactivates the RAS-related circuits for performing the dummy cycle, and the internal signal lines and internal nodes are precharged to the predetermined potential levels, respectively.

Figure 5:
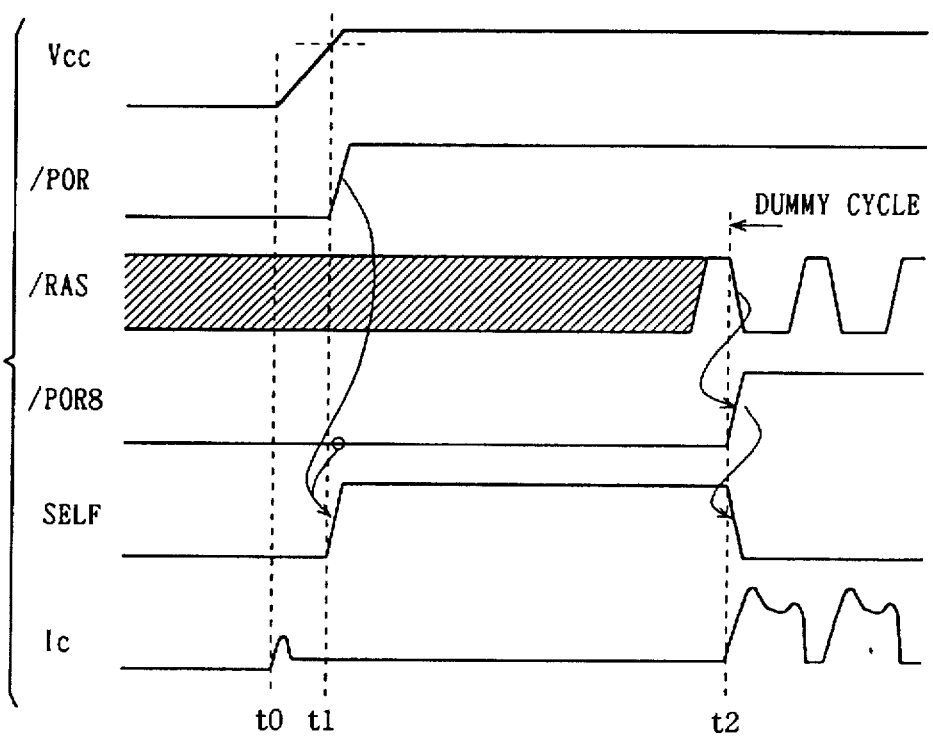
FIG. 5 is a signal waveform diagram representing an operation of the semiconductor memory device shown in FIG. 4.

As can be seen from the waveform diagram of FIG. 5, gate circuit 15c receiving power-on detection signal /POR and row address strobe signal /RAS is used as the RAS buffer. Owing to this, it is possible to reduce a current for a period immediately after the power-on and before rising of power-on detection signal /POR to H-level regardless of the voltage levels (i.e., H- and L-levels) of row address strobe signal /RAS, and therefore it is possible to reduce a current consumption during a period from the power-on to the dummy cycle. Now, structures of respective parts will be described below. [Power-on Detection Circuit] FIG. 6A shows an example of a structure of power-on detecting circuit 22 shown in FIGS. 1 and 4. In FIG. 6A, power-on detecting circuit 22 includes a resistance element 22a connected between power supply node 21 and an internal node 22b, a capacitance element 22c connected between an internal node 22b and a ground node, an inverter 22d for inverting the voltage signal on internal node 22b, and an inverter 22e for inverting the output signal of inverter 22d. Inverter 22e provides power-on detection signal /POR. An operation of the power-on detecting circuit shown in FIG. 6A will be described below with reference to an operation waveform diagram of FIG. 6B.

At time T0, the power is turned on, and the voltage level of power supply voltage Vcc on power supply node 21 rises. In accordance with this power-on, the potential on internal node 22b slowly rises with a time constant depending on the resistance value of resistance element 22a and the capacitance value of capacitance element 22c. At time T1, the potential on node 22b exceeds the input logical threshold of inverter 22d. Thereby, the output signal of inverter 22d attains L-level, and power-on detection signal /POR from inverter 22e rises to H-level.

When the time constant determined by the resistance value of resistance element 22a and the capacitance value of capacitance element 22c is large, the potential level on node 22b exceeds the input logical threshold of inverter 22d at time T2, as represented by a one-dot chain line in FIG. 6B, and power-on detection signal /POR rises to H-level. In the case where power-on detection signal /POR is raised to H-level at time T2, power-on detection signal /POR is activated when the voltage level of power supply voltage Vcc reaches a predetermined voltage level and is stabilized at this predetermined voltage level. Power-on detection signal /POR may be activated at either timing.

[Dummy Cycle Detecting Circuit]

FIG. 7 shows an example of a structure of the dummy cycle detecting circuit 24. In FIG. 7, dummy cycle detecting circuit 24 includes a one-shot pulse generating circuit 24a for generating a pulse signal of one shot in response to rising of power-on detection signal /POR, a one-shot pulse generating circuit 24b which is activated in response to inactivation of dummy cycle detection signal /POR8 and generates a pulse signal of one shot in response to falling of row address strobe signal /RAS, an AND circuit 24c which receives power-on detection signal /POR and the output signal of one-shot pulse generating circuit 24b, and a set/reset flip-flop 24d which is set in accordance with the output signal of AND circuit 24c and is reset in accordance with the output signal of one-shot pulse generating circuit 24a. Dummy cycle detecting signal /POR8 is generated from an output Q of set/reset flip-flop 24d.

One-shot pulse generating circuit 24a includes three cascaded inverters 24aa, 24ab and 24ac receiving power-on detection signal /POR, and also includes an AND circuit 24ad receiving power-on detection signal /POR and the output signal of inverter 24ac. The inverters 24aa, 24ab and 24ac are not restricted in number as long as an odd number of stages are provided.

One-shot pulse generating circuit 24b includes an NAND circuit 24ba receiving row address strobe signal /RAS and dummy cycle detection signal /POR8 through an inverter 24e, an inverter 24bb receiving the output signal of NAND circuit 24ba, an inverter 24bc receiving the output signal of inverter 24bb, and an NOR circuit 24bd receiving row address strobe signal /RAS and the output signal of inverter 24bc. An operation will be described below.

When power-on detection signal /POR is at L-level, the output signal of AND circuit 24ad is at L-level. At this time, the output signal of inverter 24ac is at H-level. When power-on detection signal /POR rises to H-level, the output signal is still at H-level, and the output signal of AND circuit 24ad rises to H-level. When the delay time of inverters 24aa, 24ab and 24ac elapses, the output signal of inverter 24ac attains L-level, and the output signal of AND circuit 24ad attains L-level. In response to the pulse signal from one-shot pulse generating circuit 24a, set/reset flip-flop 24d is reset, and dummy cycle detection signal /POR8 is reset to L-level. When power-on detection signal /POR rises to H-level, AND circuit 24c is enabled to pass the output signal of one-shot pulse generating circuit 24b therethrough.

Before execution of the dummy cycle, dummy cycle detection signal /POR8 is at L-level, and the output signal of inverter 24e is at H-level. When row address strobe signal /RAS is at L-level, the output signal of NAND circuit 24ba is at H-level, so that the output signal of inverter 24bc is at H-level, and the output signal of NOR circuit 24bd is at L-level. When row address strobe signal /RAS is set to H-level, the output signal of NOR circuit 24bd is at L-level. NAND circuit 24ba operates as an inverter while the output signal of inverter circuit 24e is at H-level.

When row address strobe signal /RAS falls from H-level to L-level, the output signal of inverter 24bc is still at L-level, and the output signal of NOR circuit 24bd rises to H-level. When the delay time of NAND circuit 24ba and inverters 24bb and 24bc elapses, the output signal of inverter 24bc rises to H-level, and responsively the output signal of NOR circuit 24bd falls to L-level. The pulse width of pulse signal of one-shot pulse generating circuit 24a is determined by the delay time of inverters 24aa, 24ab and 24ac. Also, the pulse width of one-shot pulse from one-shot pulse generating circuit 24b is determined by the delay times of NAND circuit 24ba and inverters 24bb and 24bc.

When the output signal of one-shot pulse generating circuit 24b rises to H-level, the output signal of AND circuit 24c rises to H-level, set/reset flip-flop 24d is set and dummy cycle detection signal /POR8 rises to H-level. When dummy cycle detection signal /POR8 rises to H-level, the output signal of inverter 24e is driven to L-level, so that the output signal of NAND circuit 24ba is fixed at H-level. Therefore, when the delay time of inverter 24e, NAND circuit 24ba and inverters 24bb and 24bc elapses after dummy cycle detection signal /POR8 attains the active state of H-level, the output signal of NOR circuit 24bd is fixed at L-level. Thereby, one-shot pulse generating circuit 24b stops its operation during the subsequent dummy cycles and ordinary accesses, and its current consumption is reduced.

[Self-Refresh Control Signal Generating Circuit]

Figure 8:
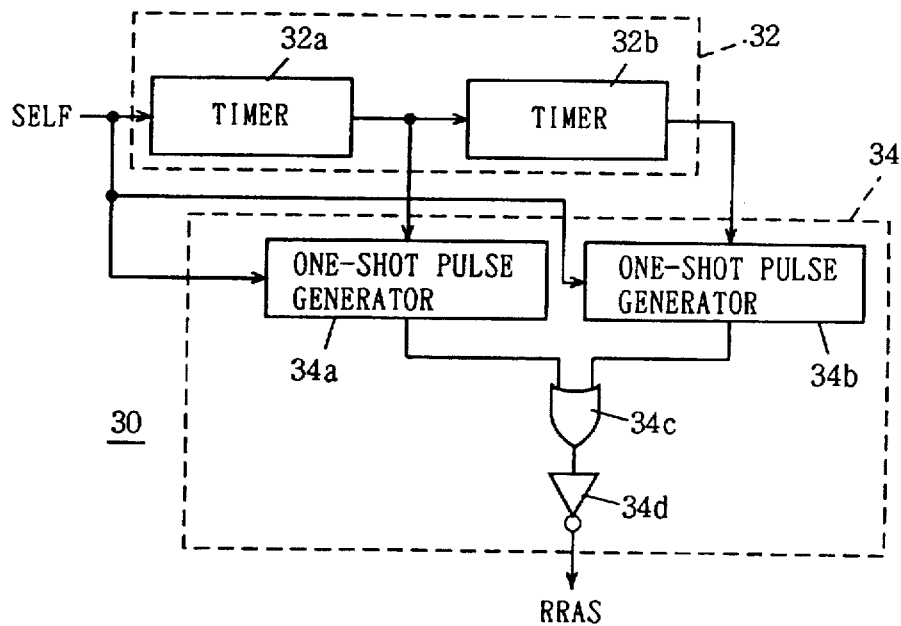
FIG. 8 schematically shows a structure of a self-refresh control signal generating circuit shown in FIG. 1.

FIG. 8 schematically shows a structure of self-refresh control signal generating circuit 30. In FIG. 8, a timer circuit 32 includes a timer 32a which is activated in response to activation of self-refresh instructing signal SELF and counts a period of, e.g., 100 µs, and a timer 32b which is activated in response to a count-up signal from timer 32a, performs counting a predetermined refresh period of, e.g., 16 µs and generates a count-up signal upon count-up thereof.

Timer 32a is active to hold the output signal thereof in the active state after completion of the count-up thereof while self-refresh instructing signal SELF is active. Timer 32b is active to repeat the count-up operation to generate a count-up indicating signal upon each count-up while the output signal of timer 32a is active.

The self-refresh control circuit 34 includes a one-shot pulse generating circuit 34a which generates a pulse signal of one shot having a predetermined pulse width in response to activation of the output signal of timer 32a, a one-shot pulse generating circuit 34b which generates a pulse signal of one shot having a predetermined pulse width in response to rising of the output signal of timer 32b, an OR circuit 34c receiving the output signals of one-shot pulse generating circuits 34a and 34b, and an inverter 34d receiving the output signal of OR circuit 34c. Each of circuits 34a and 34b generates the pulse signal which is active at H-level during a period from selection of a word line in memory cell array 1 to completion of sensing, amplification and latching of the data of memory cells connected to the selected word line.

One-shot pulse generating circuits 34a and 34b are activated to generate one-shot pulses when self-refresh instructing signal SELF is active. One-shot pulse generating circuits 34a and 34b may include the structure of one-shot pulse generating circuit 24a or 24b shown in FIG. 7. Alternatively, each of one-shot pulse generating circuits 34a and 34b may have a structure comprised of a set/reset flip-flop and a delay circuit. In this structure, the flip-flop is set in response to activation of the output signal of timer 32a or 32b, and is reset after an elapse of a delay time of the delay circuit.

Figure 9:
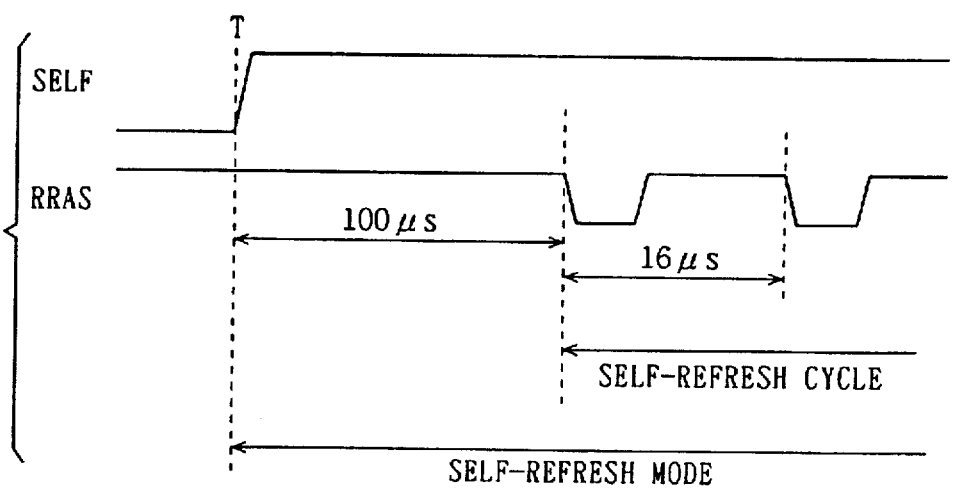
FIG. 9 is a waveform diagram representing an operation of the self-refresh control signal generating circuit shown in FIG. 8.

An operation of the self-refresh control signal generating circuit shown in FIG. 8 will be described below with reference to a waveform diagram in FIG. 9. At time T, self-refresh instructing signal SELF rises to H-level representing the active state, so that timer 32a is activated to perform counting. Timer 32a generates the count-up signal after self-refresh instructing signal SELF is held in the active state for a predetermined period of, e.g., 100 µs. Responsively, one-shot pulse circuit 34a generates the pulse signal of one shot so that refresh activating signal RRAS is kept at L-level for a predetermined period and internally a row selection is performed. Then, timer 32b is activated to generate the count-up signal at predetermined periods of 16 µs, so that refresh activating signal RRAS is activated and attains L-level.

At time T, self-refresh instructing signal SELF is driven to the active state of H-level, and this semiconductor memory device internally maintains the standby state until a predetermined time of 100 µs elapses. Upon elapsing of 100 µs, the self-refresh cycle starts, and refreshing of memory cell data is executed at predetermined periods.

Therefore, for a period of 100 µs after power-on detection signal /POR is activated and attains the H-level, the semiconductor memory device can maintain the standby state unless the dummy cycle is executed. In the case where the dummy cycle is executed after entry into the self-refresh cycle, internally the self-refreshing is performed. However, this self-refresh is executed at a relatively long cycle of 16 µs.

Therefore, even if it takes a long time from activation of power-on detection signal /POR to execution of the dummy cycle, an average current consumption can be small during this period although the self-refreshing consumes an operation current. When row address strobe signal /RAS is fixed at L-level, the internal circuits in the semiconductor memory device are stabilized in the active state and flow a much larger current than that during the standby state. Therefore, a time-average of operation current consumed by the self-refresh operation can be smaller than a total steady current during the active state. Thereby, a time-average current consumption from the power-on to execution of the dummy cycle can be reduced.

[Second Structure of Self-refresh Control Signal Generating Circuit 30]

Figure 10:
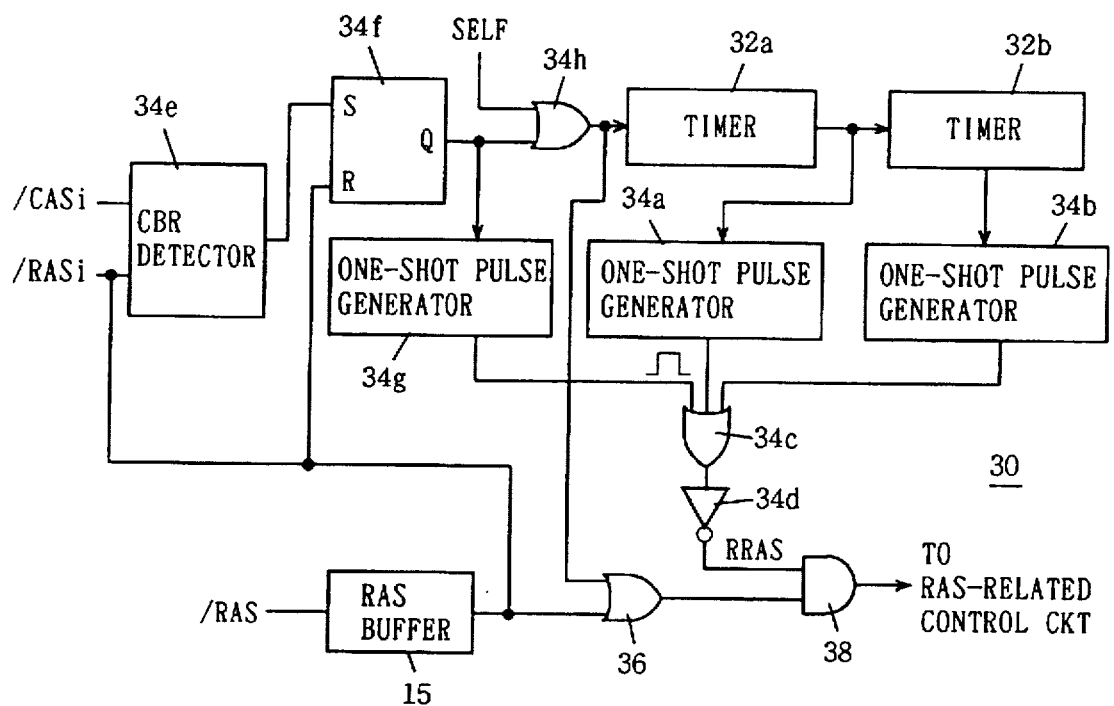
FIG. 10 shows another structure of the self-refresh control signal generating circuit shown in FIG. 1.

FIG. 10 shows another structure of self-refresh control signal generating circuit 30. In FIG. 10, self-refresh control signal generating circuit 30 includes the following structure in addition to the structure of self-refresh control signal generating circuit 30 shown in FIG. 8. Self-refresh control signal generating circuit 30 includes a CBR detecting circuit 34e which detects satisfaction of a CBR (CAS before RAS) condition in accordance with an internal row address strobe signal /RASi from RAS buffer 15 and an internal column address strobe signal /CASi from the CAS buffer (not shown), a set/reset flip-flop 34f which is set in response to CBR detection by CBR detecting circuit 34e and is reset in response to rising of internal row address strobe signal /RASi, a one-shot pulse generating circuit 34g which generates a pulse of one shot in response to rising of the output signal of set/reset flip-flop 34f, and an OR circuit 34h which receives the output signal of set/reset flip-flop 34f and self-refresh instructing signal SELF.

When the output signal of OR circuit 34h is active, timer 32a is activated and counts a predetermined time. Timer 32a performs counting and holds the count-up signal active after completion of the counting while the output signal of OR circuit 34h is active. The output signal of timer 32a is applied to one-shot pulse generating circuit 34a and timer 32b. Timer 32b performs counting, and generates count-up signals at predetermined time intervals while the output signal of timer 32a is active.

The output signals of one-shot pulse generating circuits 34a, 34b and 34e are applied to OR circuit 34c.

At a path for invalidating the externally supplied row address strobe signal, OR circuit 36 receives internal row address strobe signal /RASi from RAS buffer 15 and the output signal of OR circuit 34h, and applies the output signal thereof to one input of AND circuit 38. AND circuit 38 receives, on the other input, refresh activating signal RRAS from inverter 34d receiving the output signal of OR circuit 34c. The output signal of AND circuit 38 is applied to the RAS-related control circuit.

The self-refresh control signal generating circuit shown in FIG. 10 is comprised of a refresh control signal generating circuit of a semiconductor memory device which can operate in a conventional CBR refresh mode. In an ordinary operation mode, when column address strobe signal /CAS falls to L-level prior to fall of row address strobe signal /RAS, the output signal of CBR detecting circuit 34e rises to H-level, and set/reset flip-flop 34f is set. Thereby, the CBR refreshing is first performed in accordance with the CBR detection, and then the ordinary self-refreshing which has already been described is performed.

According to the structure shown in FIG. 10, the structure of the conventional CBR self-refresh control circuit is employed, and self-refresh instructing signal SELF is applied to OR circuit 34h receiving the output signal of set/reset flip-flop 34f. Thus, the semiconductor memory device can be kept in the self-refresh mode until the dummy cycle is executed after power-on without provision of an additional dedicated self-refresh control circuit.

This self-refresh control signal generating circuit also includes a circuit portion controlling an operation of the refresh address counter as well as a portion generating a switching control signal for selecting the refresh address. However, these portions are not shown in the figure. These portions are merely to have structures in which the count of the refresh address counter is updated in response to rising of the refresh activating signal, and the output signal of the refresh address counter is selected by the switching circuit in accordance with the output signal of OR circuit 34h.

According to the embodiment 1 of the invention, as described above, the semiconductor memory device is kept in the self-refresh mode until the dummy cycle is executed after the power-on. Therefore, the current consumption immediately after power-on and before execution of the dummy cycle can be reduced regardless of the logical level of row address strobe signal /RAS.

Embodiment 2

Figure 11:
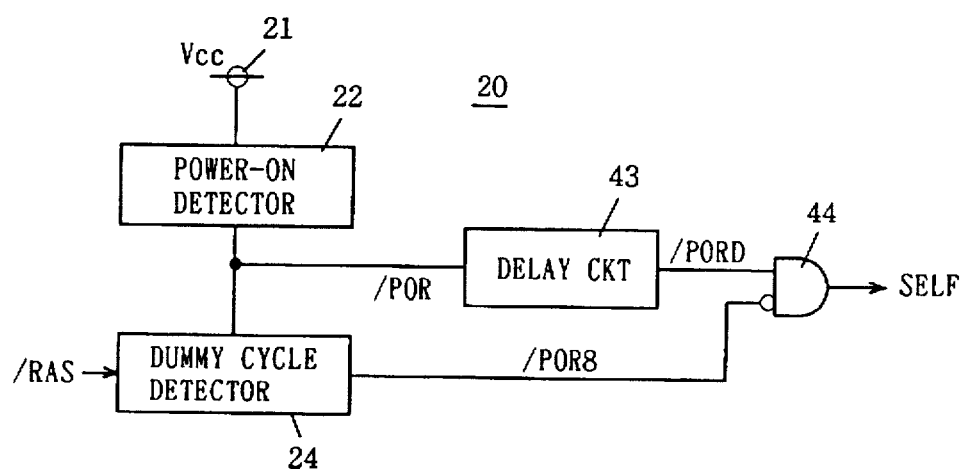
FIG. 11 thematically shows a structure of a main portion of a semiconductor memory device according to an embodiment 2 the invention.

FIG. 11 shows a structure of a main portion of a semiconductor memory device according to an embodiment 2 of the invention. FIG. 11 shows a structure of initializing circuit 20. In FIG. 11, the initializing circuit 20 includes a power-on detecting circuit 22 which is connected to power supply node 21 and detects the power-on in accordance with the voltage level of power supply voltage Vcc, a dummy cycle detecting circuit 24 which is initialized in accordance with power-on detection signal /POR from power-on detecting circuit 22, and detects a designation of the dummy cycle in accordance with externally supplied row address strobe signal /RAS, a delay circuit 43 which delays power-on detection signal /POR by a predetermined time, and a detecting circuit 44 which receives a delayed power-on detection signal /PORD from delay circuit 43 and dummy cycle detection signal /POR8 from dummy cycle detecting circuit 24.

Figure 12:
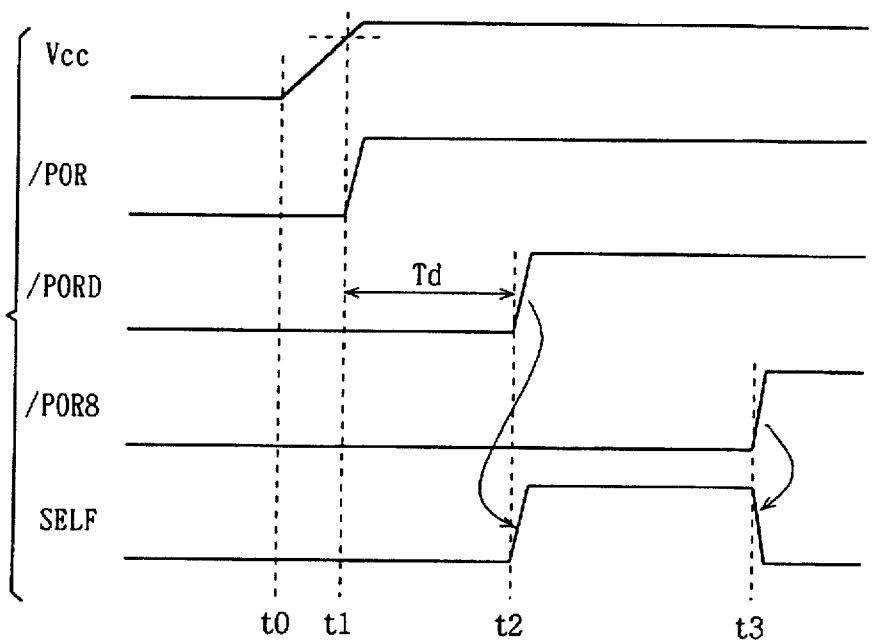
FIG. 12 is a signal waveform diagram representing an operation of an initializing circuit shown in FIG. 11.

Gate circuit 44 generates self-refresh instructing signal SELF to the self-refresh control signal generating circuit. The self-refresh control signal generating circuit may include either of the structures shown in FIGS. 8 and 10. Gate circuit 44 drives self-refresh instructing signal SELF to the active state of H-level when delayed power-on detection signal /PORD is at H-level and dummy cycle detection signal /POR8 is at L-level. An operation of the initializing circuit shown in FIG. 11 will be described below with reference to a waveform diagram of FIG. 12.

At time t0, power is turned on, and the voltage level of power supply voltage Vcc rises. When power supply voltage Vcc reaches a predetermined voltage level or is stabilized at a constant voltage level, power-on detection signal /POR is set to the active state of H-level at time t1. Delayed power-on detection signal /PORD from delay circuit 43 maintains L-level.

When a delay time Td of delay circuit 43 elapses, delayed power-on detection signal /PORD rises to H-level at time t2. When the dummy cycle is not yet performed, dummy cycle detection signal /POR8 is at L-level, and self-refresh instructing signal SELF from gate circuit 44 rises to the active state of H-level.

When the dummy cycle is executed at time t3, dummy cycle detection signal /POR8 rises to H-level, and self-refresh instructing signal SELF falls to L-level.

When the power is turned on while row address strobe signal /RAS is at L-level, the current is consumed for a period from time t0 of power-on to time t2 of rising of delayed power-on detection signal /PORD. However, if the dummy cycle is not performed before time t2, self-refresh instructing signal SELF is activated and attains H-level in accordance with delayed power-on detection signal /PORD, and the semiconductor memory device is internally set to the initial state. For a period from time t2 to time t3, therefore, the current consumption of the semiconductor memory device can be reduced to a standby current of, e.g., several microamperes, and thus the current consumption can be smaller than that in the prior art device. In a period from time t2 to time t3, the self-refreshing may be executed. However, this self-refreshing is executed at intervals of, e.g., 16 μs. Therefore, the average current can be small, and the current consumption from time t2 to time t3 can be smaller than that in the prior art device.

When the dummy cycle is performed before elapsing of the delay time of delay circuit 43, the self-refresh mode is not entered. However the current consumption can be reduced in accordance with the embodiment 2, when execution of the dummy cycle is delayed by a time longer than the delay time Td of delay circuit 34.

According to the embodiment 2 of the invention, as described above, the semiconductor memory device is set to the self-refresh mode when execution of the dummy cycle is delayed by a time longer the predetermined time. Therefore, the current consumption of the semiconductor memory device can be reduced.

Embodiment 3

Figure 13:
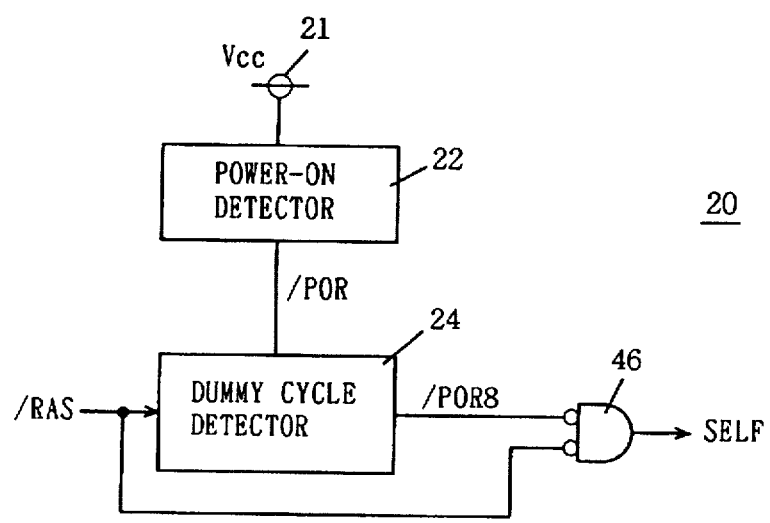
FIG. 13 schematically shows a structure of a main portion of a semiconductor memory device according to an embodiment 3 of the invention.

FIG. 13 shows a structure of a main portion of a semiconductor memory device according to the embodiment 3 of the invention. More specifically, FIG. 13 shows a structure of initializing circuit 20. In FIG. 13, initializing circuit 20 includes an NOR circuit 46 which receives dummy cycle detection signal /POR8 and externally supplied row address strobe signal /RAS. NOR circuit 46 generates self-refresh instructing signal SELF. Power-on detection signal /POR is not used for controlling the self-refresh operation. Power-on detection signal /POR is used merely for initializing and activating dummy cycle detecting circuit 24. Now, an operation of the initializing circuit shown in FIG. 13 will be described below with reference to FIGS. 14 and 15.

Figure 14:
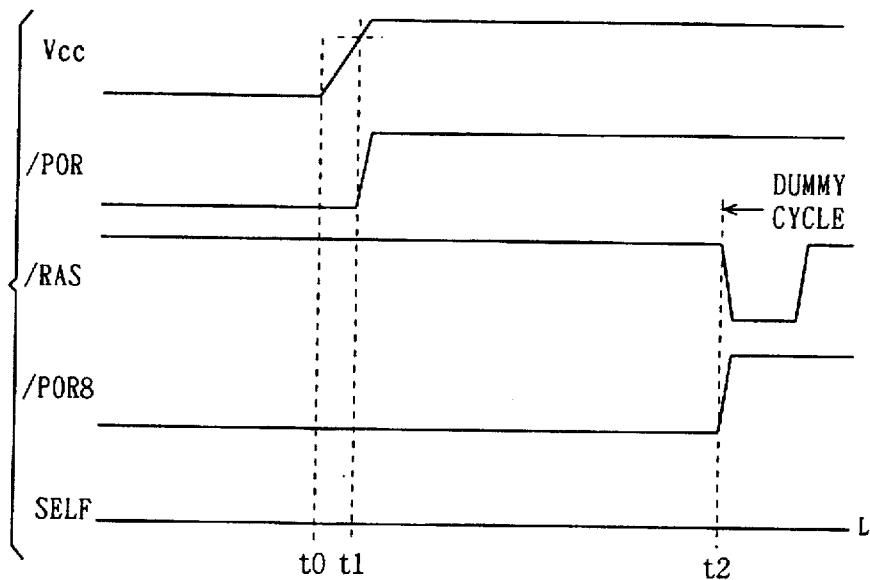
FIG. 14 is a signal waveform diagram representing an operation of an initializing circuit shown in FIG. 13.

First, at time t0 in FIG. 14, the power is turned on with row address strobe signal /RAS set at H-level, and the voltage level of power supply voltage Vcc rises. When the voltage level of power supply voltage Vcc rises to or above a predetermined voltage level, or is stabilized at a constant level, power-on detection signal /POR rises to H-level at time t1. Since row address strobe signal /RAS is held at H-level, self-refresh instructing signal SELF from NOR circuit 46 is fixed at L-level.

At time t2, row address strobe signal /RAS falls to L-level, and the dummy cycle starts. In accordance with execution of the dummy cycle, dummy cycle detection signal /POR8 from dummy cycle detecting circuit 24 rises to H-level. Even in this state, self-refresh instructing signal SELF maintains L-level.

In the structure of the initializing circuit shown in FIG. 13, setting of the semiconductor memory device to the self-refresh mode is not performed when the power is turned on while row address strobe signal /RAS is at H-level. Row address strobe signal /RAS is at H-level, and the internal circuits of the semiconductor memory device are in the initial state, so that only a standby current, i.e., an extremely small current flows over nearly entire periods, although a small peak current flows immediately after power-on.

Figure 15:
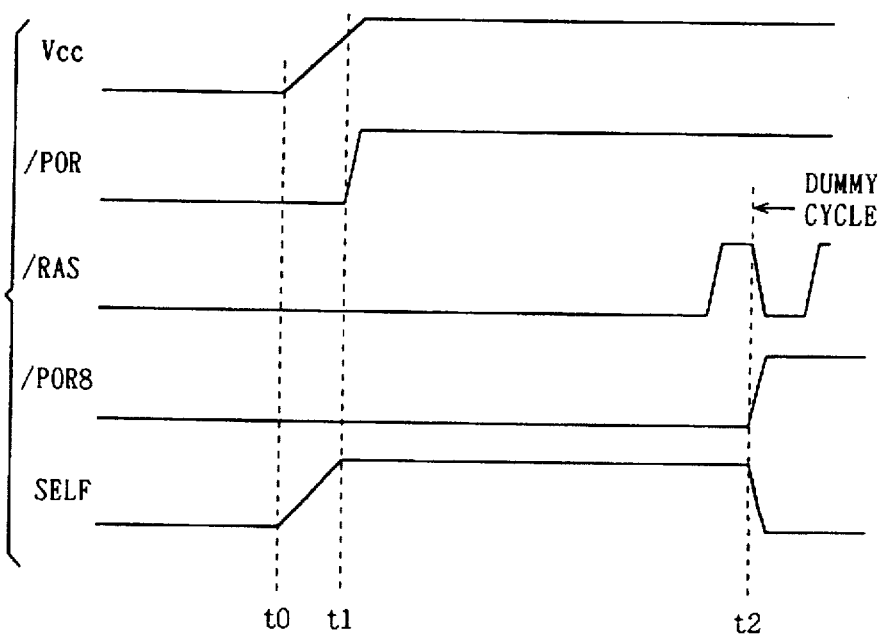

Now, as shown in FIG. 15, the power is turned on while row address strobe signal /RAS is at L-level. When the operation power supply voltage of OR circuit 46 rises in accordance with this power-on, self-refresh instructing signal SELF attains H-level and its voltage level rises in accordance with rising of power supply voltage Vcc, because dummy cycle detection signal /POR8 and row address strobe signal /RAS are both at L-level.

At time t1, power-on detection signal /POR rises to H-level. In this state, self-refresh instructing signal SELF is at H-level, and semiconductor memory device is in the refresh mode. According to this structure, therefore, the internal row address strobe signal is held at the inactive state of H-level after power-on at time to, so that the internal circuits are merely held at the standby state. Therefore, the current consumption of this semiconductor memory device can be reduced even immediately after power-on.

At time t2, row address strobe signal /RAS which was once raised to H-level falls to L-level, so that the dummy cycle starts. In accordance with execution of the dummy cycle, dummy cycle detection signal /POR8 is activated to attain H-level, and self-refresh instructing signal SELF falls to the inactive state of L-level. Thereby, RAS-related control circuit operates in accordance with externally supplied row address strobe signal /RAS, and the internal circuits are initialized.

In the prior art device, the current consumption increases immediately after power-on in such a case that the power is turned on with row address strobe signal /RAS set at L-level. Therefore, by setting the semiconductor memory device to the self-refresh mode when the power is turned on with row address strobe signal /RAS set at L-level, the internal row address strobe signal applied to the RAS-related control circuit can be set to the inactive state of H-level, and the internal circuits can be held at the initial state. Therefore, even when the power is turned on with row address strobe signal /RAS set at L-level, the current consumption can be reduced to an extent similar to that in the case of power-on with row address strobe signal /RAS set at H-level (if self-refreshing is not performed).

Even if the self-refreshing is internally performed during a period from time t1 to time t2, the self-refreshing is performed at intervals of, e.g., 16 µs. Therefore, the average current during this period is small, so that the current consumption can be reduced compared with the case where the internal circuits are always held active and a steady current in the active state flows.

As described above, the embodiment 3 of the invention employs a structure in which the self-refresh mode is set at the time of power-on if row address strobe signal /RAS is at L-level. Therefore, for a period starting immediately after power-on to execution of the dummy cycle, the internal circuits can be kept in the standby state regardless of the logical level of row address strobe signal /RAS, and the current consumption can be reduced. Even if the self-refreshing is performed, the average current consumption is small, and a similar effect of reducing the current consumption can be achieved.

Embodiment 4

Figure 16:
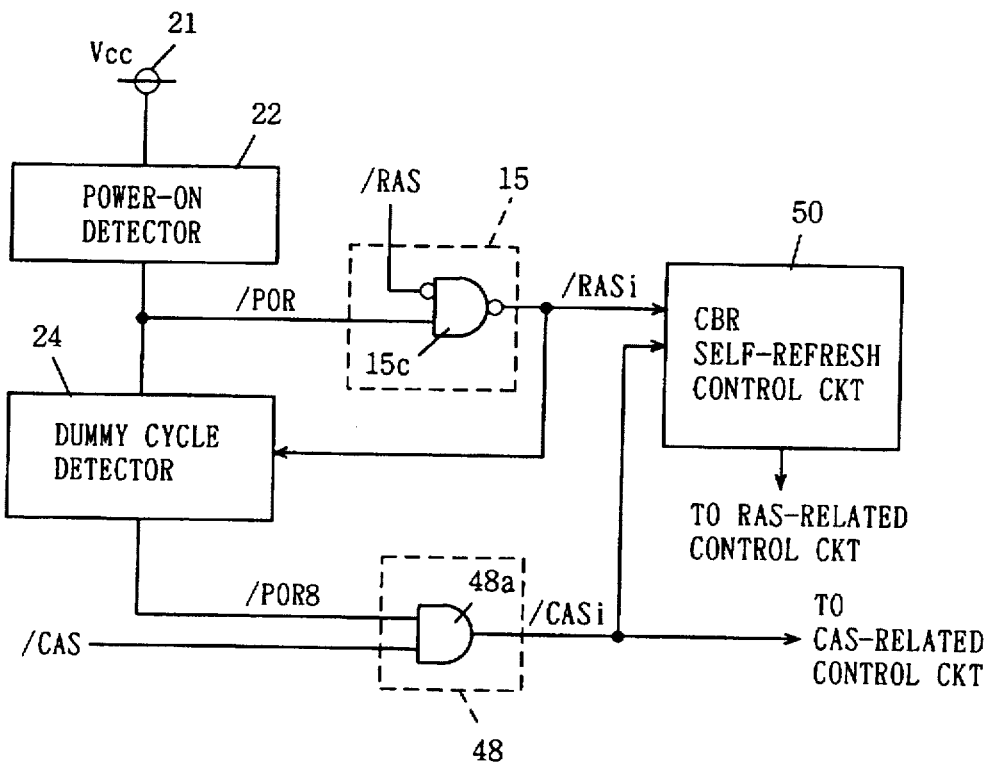
FIG. 16 schematically shows a structure of a main portion of a semiconductor memory device according to an embodiment 4 of the invention.

FIG. 16 schematically shows a structure of a main portion of a semiconductor memory device according to an embodiment 4 of the invention. In FIG. 16, the semiconductor memory device includes an RAS buffer 15 which receives power-on detection signal /POR from power-on detecting circuit 22 and externally supplied row address strobe signal /RAS, and generates internal row address strobe signal /RASi, a CAS buffer circuit 48 which receives dummy cycle detection signal /POR8 from dummy cycle detecting circuit 24 and externally supplied column address strobe signal /CAS, and produces internal column address strobe signal /CASi, and a CBR self-refresh control circuit 50 which receives internal row address strobe signal /RASi and internal column address strobe signal /CASi, and applies to the RAS-related control circuit the control signal required for self-refreshing when the self-refresh mode is designated.

Power-on detecting circuit 22 and dummy cycle detecting circuit 24 have the same structures as those in the foregoing embodiments 1 to 3. RAS buffer 15 includes a gate circuit 15c which drives internal row address strobe signal /RASi to L-level when power-on detection signal /POR is at H-level and externally supplied row address strobe signal /RAS is at L-level. CAS buffer 48 includes an AND circuit 48a which sets internal column address strobe signal /CASi to H-level when externally supplied column address strobe signal /CAS and dummy cycle detection signal /POR8 are H-level.

CBR self-refresh control circuit 50 determines that the self-refresh mode is designated when internal column address strobe signal /CASi is lowered to L-level prior to lowering of internal row address strobe signal /RASi, and generates and applies the control signal required for self-refreshing to the RAS-related control circuit.

Figure 17:
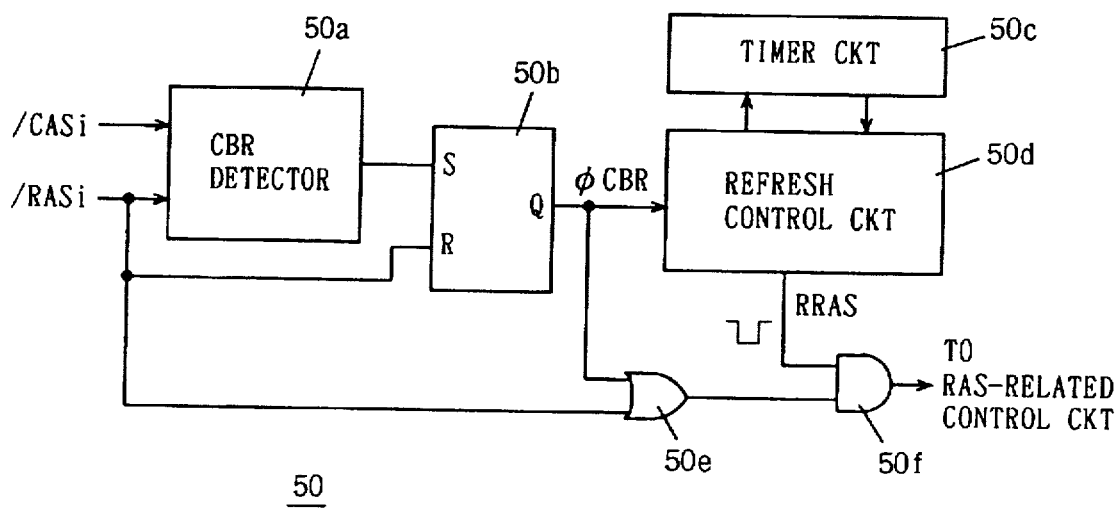
FIG. 17 schematically shows a structure of a CBR self-refresh control circuit shown in FIG. 16.

FIG. 17 schematically shows a structure of CBR self-refresh control circuit 50 shown in FIG. 16. In FIG. 17, CBR self-refresh control circuit 50 includes a CBR detecting circuit 50a which receives internal row address strobe signal /RASi and internal column address strobe signal /CASi, and detects the fact that the CBR condition is satisfied, a set/reset flip-flop 50b which is set in response to the CBR condition detection instruction from CBR detecting circuit 50a, and is reset in response to rising of internal row address strobe signal /RASi, a refresh control circuit 50d which is activated to start a timer circuit 50c when a self-refresh instructing signal φCBR from set/reset flip-flop 50b is active, and generates refresh activating signal RRAS at predetermined time intervals, an OR circuit 50e which receives self-refresh instructing signal φCBR and internal row address strobe signal /RASi, and an AND circuit 50f which receives refresh activating signal RRAS from refresh control circuit 50d and the output signal of OR circuit 50e. AND circuit 50f applies the internal operation activating signal to the RAS-related control circuit.

Figure 18:
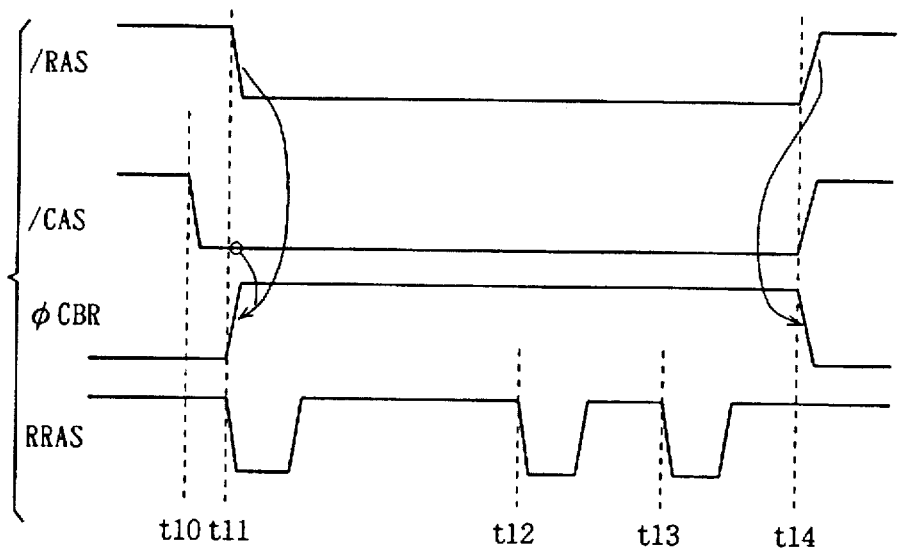
FIG. 18 is a signal waveform diagram representing an operation of the CBR self-refresh control circuit shown in FIG. 17.

The structures of CBR detecting circuit 50a and set/reset flip-flop 50b are disclosed, for example, in Japanese Patent Laying-Open No. 3-272088 (1991) and are well known. According to these structures, self-refresh instructing signal φCBR is activated and attains H-level, when internal column address strobe signal /CASi falls at an earlier timing than internal row address strobe signal /RASi. Timer circuit 50c and refresh control circuit 50d have structures similar to those shown in FIG. 10 except for that OR circuit 30h is eliminated and the output signal of set/reset flip-flop 34f is directly applied to timer 32a. Referring to FIG. 18, an operation of the CBR self-refresh control circuit in the ordinary operation will be described below.

In FIG. 18, external column address strobe signal /CAS falls to L-level at time t10, and external row address strobe signal /RAS falls to L-level at time t11. Since this sequence satisfies the CBR condition, CBR detecting circuit 50a generates the CBR detection instructing signal, so that set/reset flip-flop 50b is set, and self-refresh instructing signal φCBR is activated and attains H-level.

In response to rising of self-refresh instructing signal φCBR, refresh control circuit 50d generates refresh activating signal RRAS having a predetermined time width. The self-refresh operation which is performed in response to rising of self-refresh instructing signal φCBR is usually called "CBR refresh". When such a state continues for a predetermined time (e.g., 100 μs) that row address strobe signal /RAS and external column address strobe signal /CAS are both held at L-level, the self-refresh cycle is entered, so that falling of refresh activating signal RRAS to L-level starts at time t12 and is performed at predetermined time intervals of, e.g., 16 μs for performing row selection as well as sensing, amplification and rewrite of the memory cell data. FIG. 18 shows the refresh operations performed at times t12 and t13. However, the refreshing will be internally and periodically repeated until external row address strobe signal /RAS rises to H-level at time t14.

When row address strobe signal /RAS rises to H-level at time t14, set/reset flip-flop 50b is reset, and self-refresh instructing signal φCBR is deactivated to attain L-level, so that the refreshing is completed.

In the CBR self-refresh mode, as shown in FIG. 18, the semiconductor memory device is in the standby state for a period from the completion of the CBR refreshing performed in synchronization with falling of external row address strobe signal /RAS to time t12.

Figure 19:
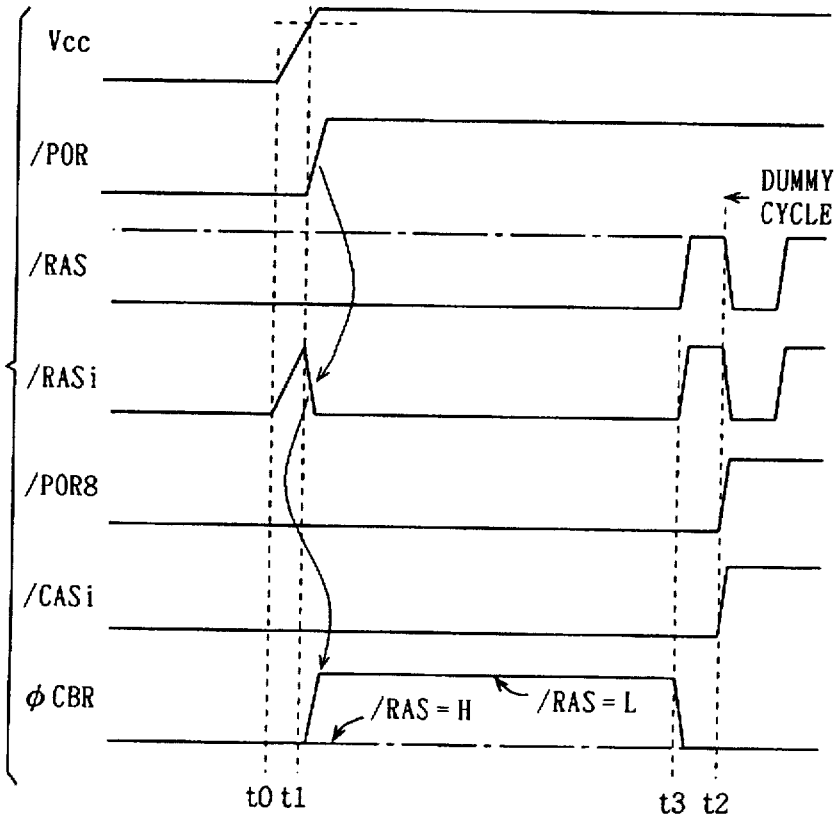
FIG. 19 is a signal waveform diagram representing an operation of the circuit shown in FIG. 16.
Figure 23:
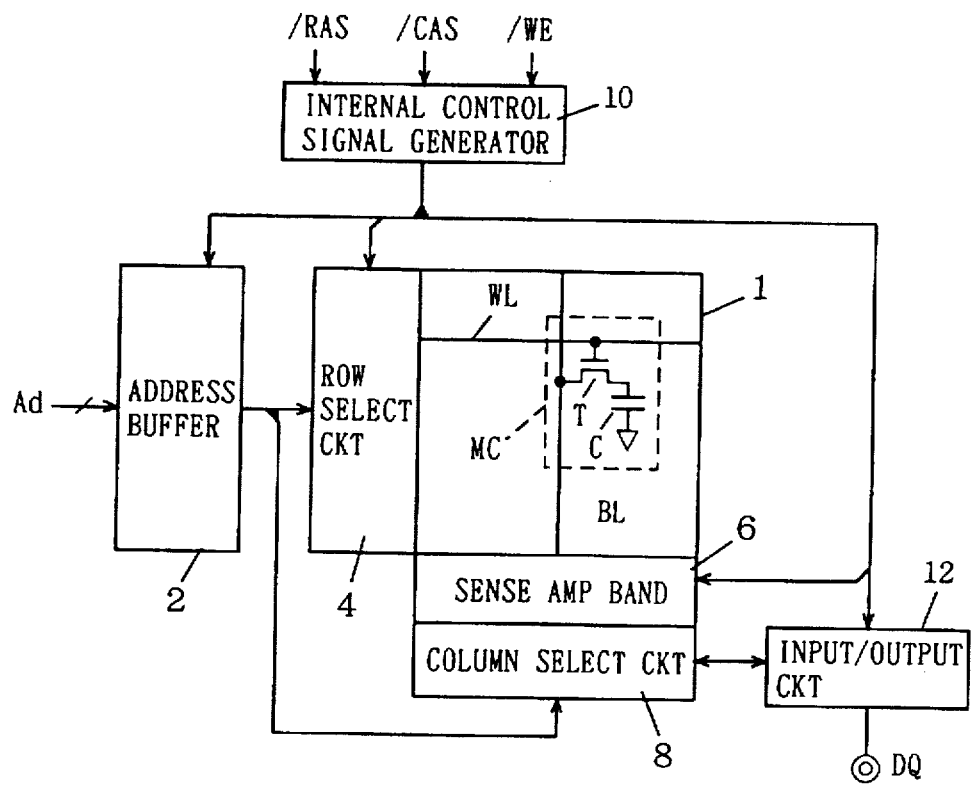
FIG. 23 Thematically shows a whole structure of a semiconductor memory device in the prior art.
Figure 24:
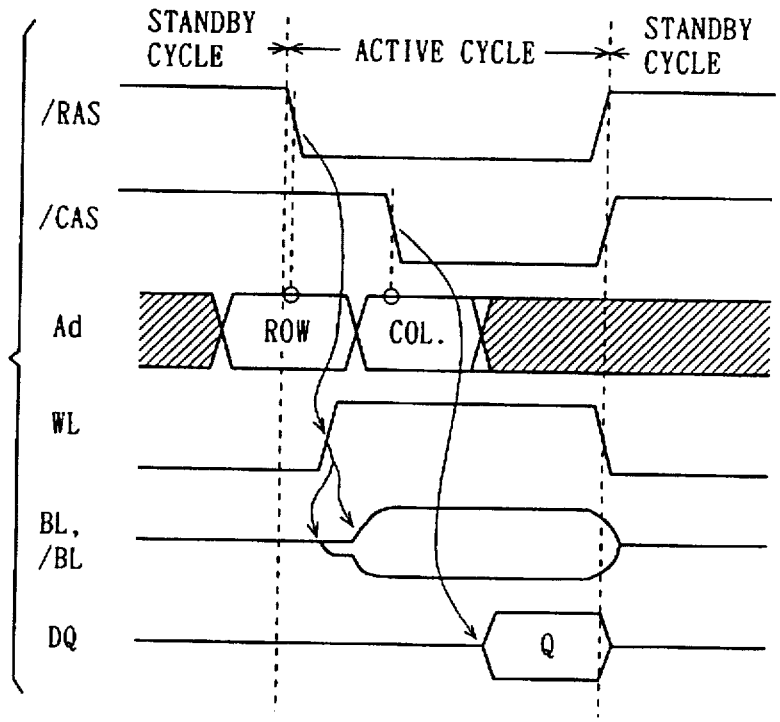
FIG. 24 is a signal waveform diagram representing an operation of the semiconductor memory device shown in FIG. 23.

Now, referring to FIG. 19, an operation of the initializing circuit shown in FIG. 16 will be described below.

The power is turned on at time t0 with external row address strobe signal /RAS set at L-level, and the voltage level of power supply voltage Vcc rises. At the time of power-on, dummy cycle detection signal /POR8 is at L-level regardless of whether the logical level of column address strobe signal /CAS is H-level or L-level, so that the internal column address strobe signal /CASi is kept at L-level (see CAS buffer 48 in FIG. 16).

As shown in FIG. 16, if row address strobe signal /RAS is at L-level, internal row address strobe signal /RASi from RAS buffer 15 is at H-level because power-on detection signal /POR is at L-level when the power is turned on. Therefore, the voltage level of internal row address strobe signal /RASi rises in accordance with the power-on. When power supply voltage Vcc reaches a predetermined voltage level or is stabilized at a constant voltage level, power-on detection signal /POR rises to H-level. At this time, internal row address strobe signal /RASi has already reached a predetermined H-level. When power-on detection signal /POR rises to H-level, internal row address strobe signal /RASi from RAS buffer 15 falls to L-level as shown in FIG. 19. Therefore, CBR self-refresh control circuit 50 is supplied with internal row address strobe signal /RASi and internal column address strobe signal /CASi under the CBR condition. Thereby, self-refresh instructing signal φCBR attains H-level, and the semiconductor memory device enters the self-refresh mode.

At time t3, external row address strobe signal /RAS is raised to H-level, preparing for the dummy cycle. In response to rising of this external row address strobe signal /RAS, internal row address strobe signal /RASi rises to H-level, and CBR self-refresh control circuit 50 releases the self-refresh mode. Owing to releasing of the self-refresh mode, the semiconductor memory device is in the standby state (internal row address strobe signal /RASi is at H-level).

At time t2, external row address strobe signal /RAS is lowered to L-level for performing the dummy cycle, dummy cycle detection signal /POR8 from dummy cycle detecting circuit 24 rises to H-level. Thereby, CAS buffer 48 produces internal column address strobe signal /CASi in accordance with externally supplied column address strobe signal /CAS (FIG. 19 shows the state where column address strobe signal /CASi is set to H-level). A circuit portion which operates in relation to internal column address strobe signal /CASi can operate when internal row address strobe signal /RASi is active. For a period from time t3 to time t2, therefore, no problem arises even if internal row address strobe signal /RASi is at H-level and internal column address strobe signal /CASi is at L-level, and the internal circuit is in the standby state. This is true for the operations of the CAS-related circuits at the time of power-on. Therefore, even if external row address strobe signal /RAS is at L-level when the power is turned on, this power-on is performed while the semiconductor memory device is in the standby state, so that the initial current consumption is extremely small.

At time t1, self-refresh instructing signal φCBR rises to H-level, and the CBR refresh is internally performed, so that a large operation current flows. This operation current is similar in magnitude to that which flows in the prior art device when the power is turned on with external row address strobe signal /RAS set at L-level. However, the semiconductor memory device returns to the standby state when this CBR refreshing is completed, so that only a small standby current flows until the next self-refreshing starts. Conversely, in the prior art device, internal row address strobe signal /RASi is held active at L-level, so that a large stable current flows. On average, therefore, the current consumption in the embodiment can be smaller than that in the prior art device, if the device is internally in the self-refresh mode.

Such a structure may be employed that the CBR refresh is inhibited while dummy cycle detection signal /POR8 is at L-level. This can further reduce the current consumption. The structure for inhibiting the CBR refresh while dummy cycle detection signal /POR8 is at L-level may be formed by modifying the circuit, which generates a one-shot pulse in response to rising of self-refresh instructing signal φCBR (see 34g in FIG. 12), into a structure which generates the one-shot pulse only when dummy cycle detection signal /POR8 is at H-level.

If a period from time t1 to time t3 is long, the self-refreshing is internally performed. This self-refreshing is performed at predetermined time intervals. Therefore, even if a relatively large current flows at the time of refreshing, the current consumption can be smaller, on average, than a total of the conventional steady current in the state where the active state is held, and thus can be reduced.

If external row address strobe signal /RAS is at H-level when the power is turned on, internal row address strobe signal /RASi is also at H-level. Therefore, as indicated by a one-dot chain line in FIG. 19, the CBR condition is not satisfied, so that self-refresh instructing signal φCBR is at L-level. Therefore, the semiconductor memory device is always in the standby state, and only a small standby current is consumed.

When the dummy cycle starts, internal row address strobe signal /RASi falls to L-level in accordance with external row address strobe signal /RAS. At this time, however, internal column address strobe signal /CASi has already risen to H-level, and the CBR condition is not satisfied in this initial dummy cycle, so that the dummy cycle is reliably executed in accordance with externally supplied row address strobe signal /RAS.

According to the embodiment 4 of the invention, as described above, when the power is turned on while the externally supplied row address strobe signal /RAS is at L-level, the semiconductor memory device internally enters the self-refresh mode, so that the current consumption of the semiconductor memory device before the dummy cycle can be smaller that in the prior art device.

Embodiment 5

FIG. 20 shows a structure of a main portion of the semiconductor memory device according to an embodiment 5 of the invention. FIG. 20 shows a circuit portion controlled by the RAS-related control circuit. In FIG. 20, the semiconductor memory device includes a comparator 70 which operates using a voltage on an external power supply node 61a as one operation power supply voltage, and makes a comparison between a reference voltage Vref and an internal power supply voltage InVcc on an internal power supply line 74, and a drive transistor 72 which is formed of a p-channel MOS transistor and supplies a current from an external power supply node 61b to internal power supply line 74 in accordance with the output signal of comparator 70.

Comparator 70 includes a comparing circuit 70a which makes a comparison between reference voltage Vref and internal power supply voltage InVcc on internal power supply line 74 when active, and a current source transistor 70b which forms a current path for comparator 70a when an activation control signal ACT is active. This activation control signal ACT is generated from the RAS-related control circuit 10b shown in the embodiments 1 to 4 in synchronization with the internal row address strobe signal.

Internal power supply line 74 is coupled to internal circuitry 76, which uses, as one operation power supply voltage, internal power supply voltage InVcc on internal power supply line 74. Internal circuitry 76 includes RAS-related circuits which operate in synchronization with row address strobe signal /RAS, and more specifically includes, for example, a row select circuit and a sense amplifier band.

When activation control signal ACT is inactive and at L-level, comparator 70 is deactivated, and raises its output signal to the level of external power supply voltage ExVcc for keeping drive transistor 72 off. When activation control signal ACT is activated to attain H-level, comparator 70 is activated, and comparing circuit 70a makes a comparison between reference voltage Vref and internal power supply voltage InVcc. When internal power supply voltage Invcc is higher than reference voltage Vref, the output signal of comparator 70a is at H-level, and drive transistor 72 is off. If internal power supply voltage InVcc is lower than reference voltage Vref, the output signal of comparing circuit 70a lowers from H-level, and drive transistor 72 supplies a current from power supply node 61b to internal power supply line 74 in accordance with the conductance thereof, so that the voltage level of internal power supply voltage InVcc rises. Therefore, internal power supply voltage InVcc is maintained at the level of reference voltage Vref.

Lowering of internal power supply voltage InVcc may occur when a large operation current flows through internal power supply line 74 due to operation of internal circuitry 76. Activation control signal ACT is activated in synchronization with operation of internal circuitry 76. This compensates for lowering of internal power supply voltage InVcc due to a large operation current during operation of internal circuitry 76. When internal circuit 76 is in the standby state, only an extremely small current flows through the internal power supply line 74. Therefore, activation control signal ACT is inactive and at L-level in this state, and the current consumption in comparator 70 is reduced.

In order to compensate for the large operation current during operation of internal circuit 76 by comparator 70, a relatively fast responsibility is required, and driver transistor 72 has a large current driving capability. Therefore, comparator 70 consumes a relatively large operation current of, e.g., several microamperes.

FIG. 21 shows a sequence of generation of activation control signal ACT. In the normal mode, as shown in FIG. 21, activation control signal ACT is activated/deactivated in synchronization with falling and rising of internal row address strobe signal /RASi. In the self-refresh mode, activation control signal ACT is activated in synchronization with activation of refresh activating signal RRAS. Therefore, the structure of the embodiments 1 to 4 may be applied to the structure of the internal voltage down-converting circuit formed of comparator 70 and drive transistor 72 shown in FIG. 20. Thereby, even if external row address strobe signal /RAS is at L-level when the power is turned on, activation control signal ACT is in the standby state of L-level, and it is possible to prevent continuous flow of a current of several microamperes through comparator 70, so that the current consumption immediately after the power-on can be reduced. This is because that the activation control signal is activated/deactivated in synchronization with refresh activating signal RRAS if the semiconductor memory device enters the self-refresh mode immediately after the power-on. If the power is turned on with row address strobe signal /RAS set at H-level, the activation control signal ACT maintains the inactive state of L-level, as is apparent from the descriptions of the embodiments 1 to 4.

FIG. 22 schematically shows an example of a structure for generating activation control signal ACT.

In FIG. 22, activation control signal ACT is generated from the RAS-related control circuit. The activation control signal generating portion includes an AND circuit 80 which receives refresh activating signal RRAS on one, and an inverter 82 which inverts the output signal of AND circuit 80. AND circuit 80 is supplied with an output signal of an OR circuit which receives self-refresh instructing signal (SELF or φCBR) and the internal row address strobe signal from the RAS buffer. AND circuit 80, therefore, corresponds to AND circuit 38 shown in FIG. 4 or AND circuit 50f shown in FIG. 17. Inverter 82 is included in the RAS-related circuits, and activates activation control signal ACT when the internal RAS-related circuits are activated.

According to the embodiment 5 of the invention, as described above, the internal voltage down-converting circuit which produces the internal power supply voltage from the external power supply voltage is activate/deactivated in synchronization with the internal row address strobe signal, and the current consumption of this internal voltage down-converting circuit immediately after the power-on can be reduced regardless of the logical level of row address strobe signal /RAS.

In the foregoing embodiments 1 to 5, the row select circuit, sense amplifier band, bit line equalizing circuit and internal voltage down-converting circuit are described as the circuits related to the signal /RAS. However, all the circuits which operate and consume the current in response to the signal /RAS are controlled by this RAS-related control circuit.

According to the invention, as described above, the semiconductor memory device is set in the self-refresh mode immediately after the power-on, so that the semiconductor memory device can stay in the standby state for a long time immediately after the power-on, and therefore the current consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of memory cells comprising:

a self-refresh control circuit including a timer, for generating a control signal for refreshing storage data of said plurality of memory cells at predetermined time intervals in accordance with an output signal of said timer when activated, said timer including a timer circuit for driving the output signal into an active state when an activated state of said self-refresh control circuit is maintained for a prescribed period of time; and an initializing circuit for activating said self-refresh control circuit in response to a start of external supply of a power supply voltage to said semiconductor memory device.

2. The semiconductor memory device according to claim 1, wherein said initializing circuit includes:

a dummy cycle detecting circuit for detecting a designation of a dummy cycle for initializing an internal circuit of said semiconductor memory device in accordance with an externally supplied operation cycle designation signal, and a circuit for deactivating said self-refresh control circuit in response to an activation of a dummy cycle detection signal generated from said dummy cycle detecting circuit.

3. The semiconductor memory device according to claim 1, wherein said initializing circuit includes:

a power on detecting circuit coupled to an external power supply node receiving the externally supplied power supply voltage, for detecting a supply of the power supply voltage to said semiconductor memory device in accordance with the power supply voltage on said external power supply node, and for activating said self-refresh control circuit upon detection of a start of the supply of the power supply voltage.

4. The semiconductor memory device according to claim 1, wherein said initializing circuit includes;

a power on detecting circuit coupled to an external power supply node receiving an externally supplied power supply voltage, detecting a start of supply of the power supply voltage to said semiconductor memory device in accordance with the power supply voltage on said external power supply node, and activating a power on detection signal upon detection of said start of the supply of the power supply voltage, and a delay circuit for delaying and applying the power on detection signal generated from said power on detecting circuit to said self-refresh control circuit, to activate said self-refresh control circuit.

5. The semiconductor memory device according to claim 1, wherein said initializing circuit includes;

a circuit enabled in response to an activation of an externally supplied operation cycle defining signal, for activating said self-refresh control circuit in response to the start of the supply of the power supply voltage.

6. A semiconductor memory device having a plurality of memory cells, comprising:

a self-refresh control circuit including a timer, for generating a control signal for refreshing storage data of said plurality of memory cells at predetermined time intervals in accordance with an output signal of said timer when activated; and an initializing circuit for activating said self-refresh control circuit in response to a start of external supply of a power supply voltage to said semiconductor memory device, wherein said initializing circuit includes:

a first gate circuit being enabled to pass an externally supplied first operation cycle defining signal in response to the start of the supply of the power supply voltage, dummy cycle detecting means responsive to said first operation cycle defining signal for detecting a designation of a dummy cycle for setting an internal circuit in said semiconductor memory device to an initial state, and for activating a dummy cycle detection signal upon detection of the designation of the dummy cycle, a second gate circuit for holding a second operation cycle defining signal in an inactive state in response to the inactive state of the dummy cycle detection signal from said dummy cycle detecting means, and passing said second operation cycle defining signal in response to the active state of said dummy cycle detection signal, and a timing detecting circuit receiving output signals of said first and second gate circuits, for activating said self-refresh control circuit when the received output signals satisfy a predetermined timing condition.

7. The semiconductor memory device according to claim 1, further comprising:

an internal voltage-down converting circuit for lowering said externally supplied power supply voltage to generate an internal power supply voltage when activated, wherein said plurality of memory cells are arranged in a matrix form, said self-refresh control circuit includes means for generating a row select instructing signal for driving a row of said plurality of memory cells to a selected state when activated, and said internal voltage down converting circuit is activated when said row select instructing signal is active.

8. The semiconductor memory device according to claim 1, wherein said timer circuit is responsive to said initializing circuit for measuring the prescribed time to generate said control signal when the prescribed time elapses.

9. The semiconductor memory device according to claim 6, wherein said self-refresh control circuit includes means responsive to said timing detecting circuit outputting an activating signal for first generating said control signal and then generating said control signal in accordance with an output signal of said timer.

10. The semiconductor memory device according to claim 1, wherein said initializing circuit includes, a dummy cycle detecting circuit responsive to an operation cycle defining signal for detecting whether a dummy cycle mode of operation is designated, said operation cycle defining signal defining an operation cycle of said semiconductor memory device, and said dummy cycle being performed for initializing said semiconductor memory device, and a gate for activating said refresh control circuit in response to said operation cycle defining signal being active and to said dummy cycle detecting circuit outputting an inactive signal indicating that no dummy cycle is designated.

* * * * *